United States Patent
Kang et al.

(10) Patent No.: US 11,515,322 B2
(45) Date of Patent: Nov. 29, 2022

(54) SEMICONDUCTOR DEVICES

(71) Applicant: SAMSUNG ELECTRONICS CO., LTD., Suwon-si (KR)

(72) Inventors: Seogoo Kang, Suwon-si (KR); Daehyun Jang, Suwon-si (KR); Jaeryong Sim, Suwon-si (KR); Jongseon Ahn, Suwon-si (KR); Jeehoon Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 219 days.

(21) Appl. No.: 16/890,500

(22) Filed: Jun. 2, 2020

(65) Prior Publication Data
US 2021/0098483 A1    Apr. 1, 2021

(30) Foreign Application Priority Data

Sep. 26, 2019 (KR) .................. 10-2019-0118980

(51) Int. Cl.
*H01L 27/11582* (2017.01)
*H01L 27/11575* (2017.01)
*H01L 27/11548* (2017.01)
*H01L 27/11556* (2017.01)

(52) U.S. Cl.
CPC .. *H01L 27/11575* (2013.01); *H01L 27/11548* (2013.01); *H01L 27/11556* (2013.01); *H01L 27/11582* (2013.01)

(58) Field of Classification Search
CPC ............... H01L 27/11578; H01L 27/11582
See application file for complete search history.

(56) References Cited

U.S. PATENT DOCUMENTS

| | | | |
|---|---|---|---|
| 10,290,645 B2 | 5/2019 | Nakatsuji et al. | |
| 2012/0273872 A1 | 11/2012 | Lim et al. | |
| 2016/0163732 A1 | 6/2016 | Lim et al. | |
| 2016/0358927 A1 | 12/2016 | Nam et al. | |
| 2017/0317096 A1 | 11/2017 | Shin et al. | |
| 2018/0277499 A1* | 9/2018 | Oshiki | H01L 27/11565 |
| 2018/0301407 A1 | 10/2018 | Yeh et al. | |
| 2018/0323207 A1 | 11/2018 | Shim et al. | |
| 2018/0366487 A1 | 12/2018 | Okizumi et al. | |
| 2019/0051599 A1 | 2/2019 | Zhang et al. | |
| 2019/0057898 A1 | 2/2019 | Shim et al. | |
| 2019/0088586 A1 | 3/2019 | Icninose et al. | |
| 2019/0237477 A1* | 8/2019 | Baek | H01L 27/11573 |

OTHER PUBLICATIONS

German Office action dated May 16, 2022.

* cited by examiner

*Primary Examiner* — Christopher A Johnson
(74) *Attorney, Agent, or Firm* — Lee IP Law, P.C.

(57) ABSTRACT

A semiconductor device includes a peripheral circuit region including a first substrate and circuit elements on the first substrate; and a memory cell region including a second substrate on an upper portion of the first substrate, gate electrodes spaced apart from each other and vertically stacked on the second substrate, channel structures extending vertically through the gate electrodes to the second substrate, first separation regions penetrating through the gate electrodes between the channel structures and extending in one direction, and a second separation region extending vertically to penetrate through the second substrate from above and having a bent portion due to a change in width.

20 Claims, 33 Drawing Sheets

SEMICONDUCTOR DEVICES

CROSS-REFERENCE TO RELATED APPLICATION

Korean Patent Application No. 10-2019-0118980, filed on Sep. 26, 2019, in the Korean Intellectual Property Office, and entitled: "Semiconductor Devices," is incorporated by reference herein in its entirety.

BACKGROUND

1. Field

Embodiments relate to semiconductor devices.

2. Description of the Related Art

Semiconductor devices are used to process large amounts of data while the sizes thereof are gradually decreasing, thus driving an increase in the degree of integration of semiconductor elements constituting the semiconductor devices. The degree of integration of a semiconductor device may be increased by using a vertical transistor structure instead of a planar transistor structure.

SUMMARY

Embodiments are directed to a semiconductor device, including a peripheral circuit region including a first substrate and circuit elements on the first substrate; and a memory cell region including a second substrate on an upper portion of the first substrate, gate electrodes spaced apart from each other and vertically stacked on the second substrate, a horizontal conductive layer between the second substrate and the gate electrodes, channel structures extending vertically through the gate electrodes to the second substrate, first separation regions penetrating through the gate electrodes between the channel structures and extending in one direction, a cell region insulating layer covering a stacked structure of the gate electrode, and a second separation region extending vertically to penetrate through the second substrate from above. The second separation region may include a first region extending inwardly of the second substrate from above in trench form and a second region connected to a lower end of the first region within the second substrate, the second region having a width greater than a width of the first region and having a rounded external surface.

Embodiments are also directed to a semiconductor device, including a peripheral circuit region including a first substrate and circuit elements on the first substrate; and a memory cell region including a second substrate on an upper portion of the first substrate, gate electrodes spaced apart from each other and vertically stacked on the second substrate, channel structures extending vertically through the gate electrodes to the second substrate, first separation regions penetrating through the gate electrodes between the channel structures and extending in one direction, and a second separation region extending vertically to penetrate through the second substrate from above and having a bent portion due to a change in width.

Embodiments are also directed to a semiconductor device, including a first substrate; circuit elements on the first substrate; a first insulating layer covering the circuit elements; a second substrate disposed on the first insulating layer; gate electrodes spaced apart from each other and vertically stacked on the second substrate; a second insulating layer covering the gate electrodes; and a separation region spaced apart from the gate electrodes, penetrating through the second insulating layer and the second substrate to vertically extend the second substrate, and having a bent portion.

BRIEF DESCRIPTION OF DRAWINGS

Features will become apparent to those of skill in the art by describing in detail example embodiments with reference to the attached drawings in which.

DETAILED DESCRIPTION

Hereinafter, example embodiments will be described with reference to the accompanying drawings.

Figure 1:
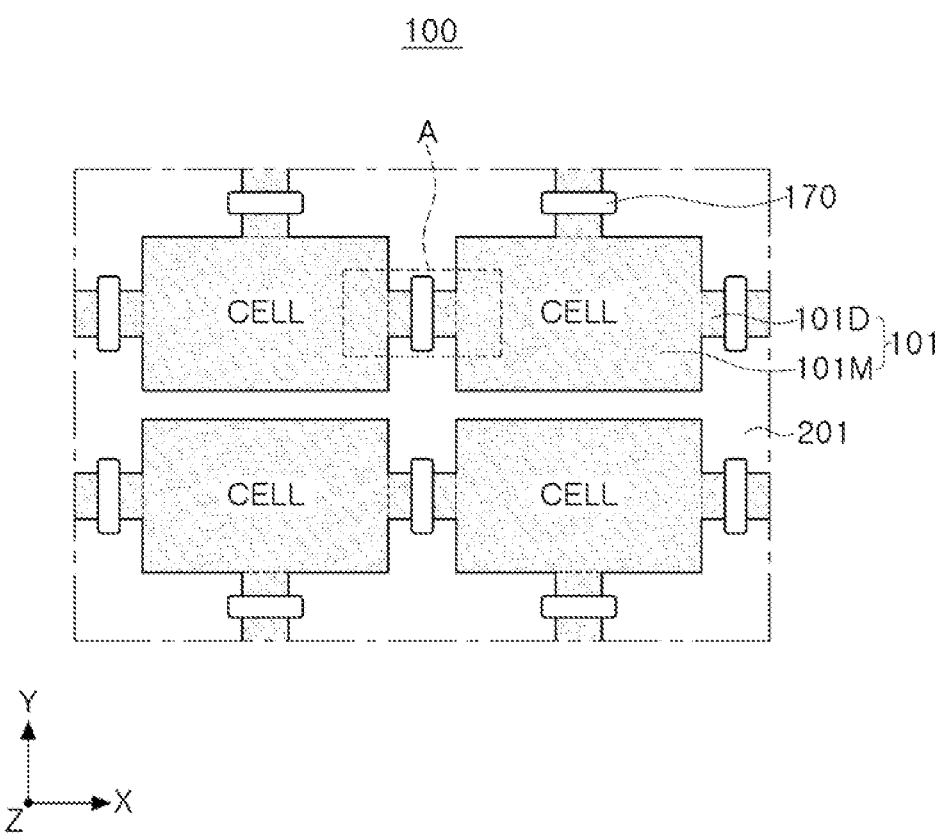
FIG. 1 is a schematic plan view of a semiconductor device according to an example embodiment.

FIG. 1 is a schematic plan view of a semiconductor device according to an example embodiment.

Figure 2A:
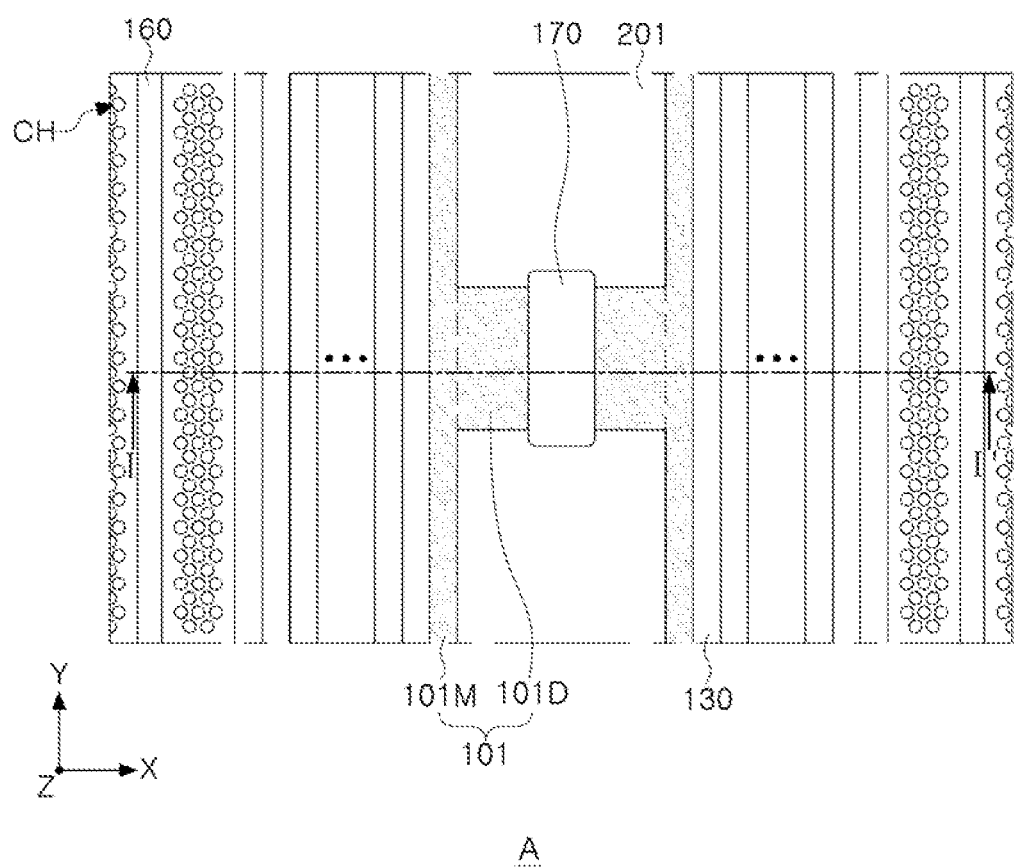
FIGS. 2A and 2B are schematic partially enlarged views of a semiconductor device according to an example embodiment.
Figure 2B:
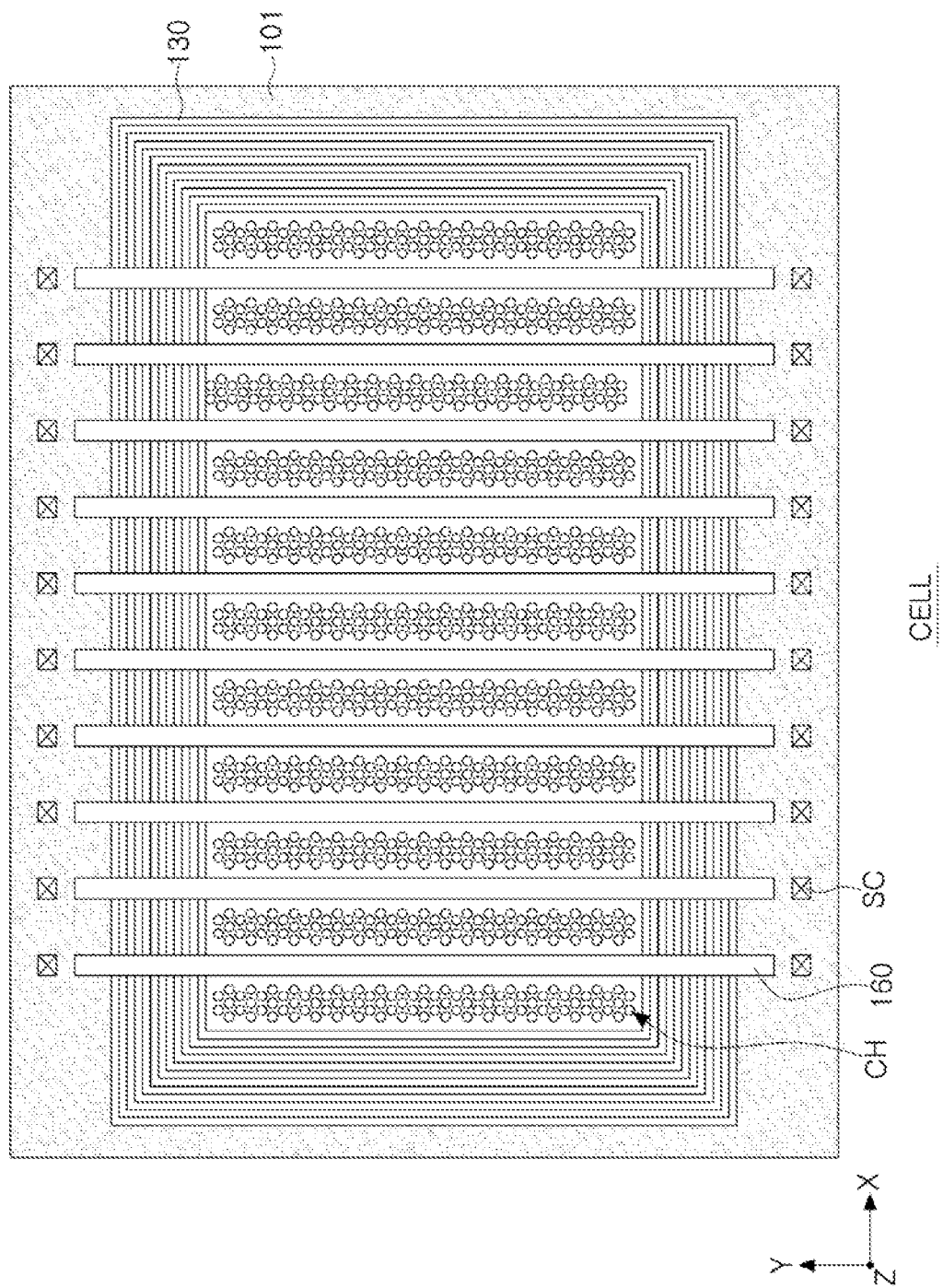

FIGS. 2A and 2B are schematic partially enlarged views of a semiconductor device according to an example embodiment. FIG. 2A is an enlarged view of region 'A' in FIG. 1, and FIG. 2B is an enlarged view of a region 'CELL' in FIG. 1.

Figure 3:
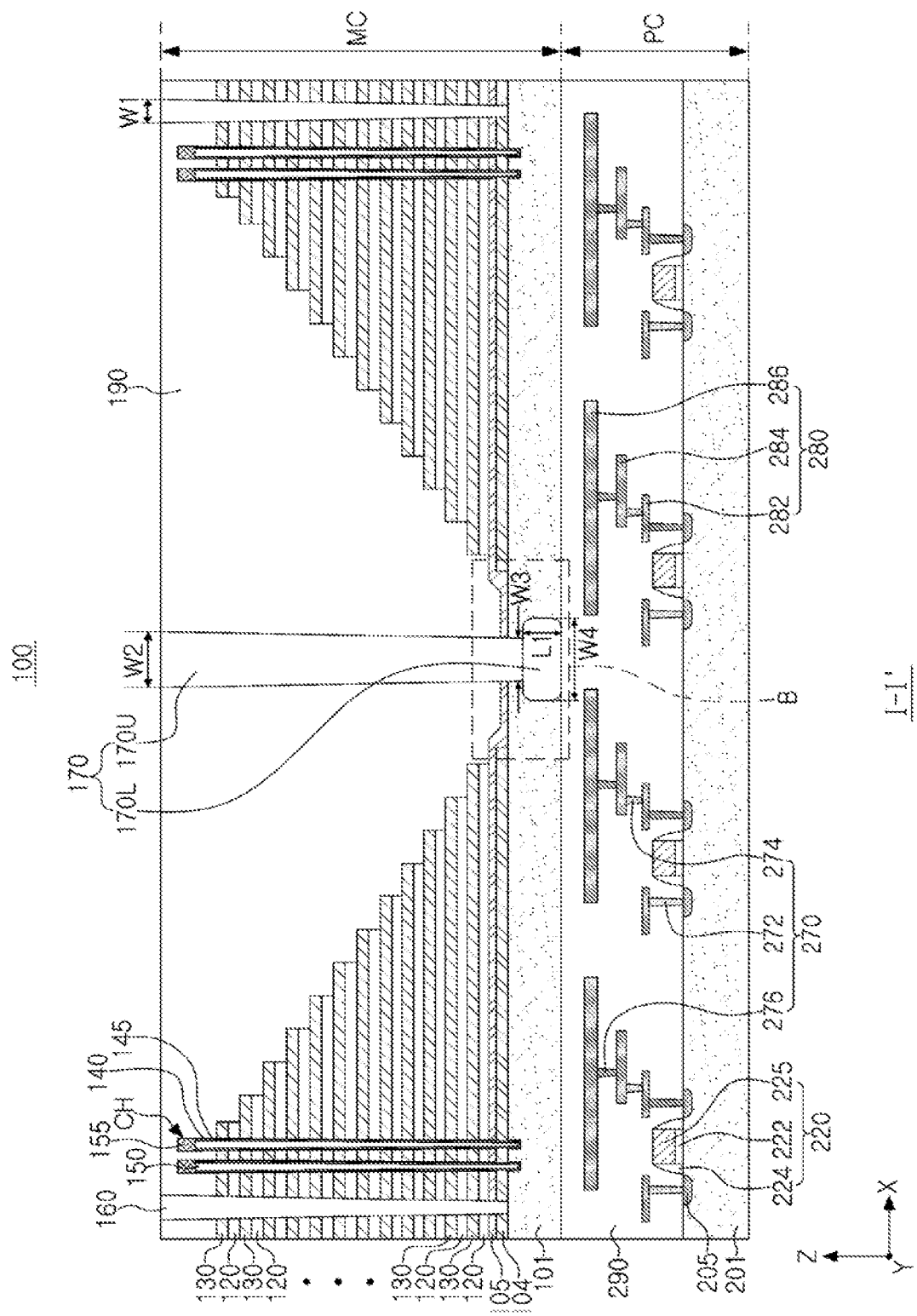
FIG. 3 is a schematic cross-sectional view of a semiconductor device according to an example embodiment.

FIG. 3 is a schematic cross-sectional view of a semiconductor device according to an example embodiment. FIG. 3 illustrates a cross section taken along line I-I' in FIG. 2A.

Referring to FIGS. 1 to 3, a semiconductor device 100 may include a peripheral circuit region PC, provided on a base substrate 201, and a memory cell region MC provided on a substrate 101. The memory cell region MC may be disposed on an upper end or surface of the peripheral circuit region PC. In another example embodiment, the memory cell region MC may be disposed on a lower end or surface of the peripheral circuit region PC.

The peripheral circuit region PC may include the base substrate 201, circuit elements 220 disposed on the base substrate 201, circuit contact plugs 270, and circuit interconnection lines 280.

The base substrate 201 may have an upper surface extending in an x direction and a y direction. In the base substrate 201, isolation layers may be formed to define active regions. Source/drain regions 205 that include impurities may be disposed in a portion of the active region. The base substrate 201 may include a semiconductor material, for example, a group IV semiconductor, a group III-V compound semiconductor, or a group II-VI compound semiconductor. The base substrate 201 may be provided as, for example, a bulk wafer or an epitaxial layer.

The circuit elements 220 in the peripheral circuit region PC may include planar transistors. Each of the circuit elements 220 may include a circuit gate dielectric layer 222, a spacer layer 224, and a circuit gate electrode 225. Source/drain regions 205 may be disposed in the base substrate 201 on opposite sides adjacent to the circuit gate electrode 225. The circuit gate dielectric layer 222 may include, for example, a silicon oxide, and the circuit gate electrode 225 may include a conductive material such as a metal, polycrystalline silicon, or a metal silicide. The spacer layer 224 may be disposed on opposite sidewalls of the circuit gate dielectric layer 222 and the circuit gate electrode 225. The spacer layer 224 may be formed of, for example, a silicon nitride.

A peripheral region insulating layer 290 may be disposed on the circuit elements 220 on the base substrate 201. The peripheral region insulating layer 290 may be formed of an insulating, for example, electrically insulating, material. The circuit contact plugs 270 may be connected to the source/drain regions 205 through the peripheral region insulating layer 290. The circuit contact plugs 270 may include first contact plugs 272, second contact plugs 274, and third contact plugs 276 sequentially stacked from the base substrate 201. An electrical signal may be applied to the circuit element 220 by the circuit contact plugs 270. In a region not illustrated, circuit contact plugs 270 may also be connected to the circuit gate electrode 225. The circuit interconnection lines 280 may be connected to the circuit contact plugs 270, and may be disposed as a plurality of layers. The circuit interconnection lines 280 may include a first circuit interconnection line 282, a second circuit interconnection line 284, and a third circuit interconnection line 286. The circuit contact plugs 270 and the circuit interconnection lines 280 may include a metal, for example, tungsten (W), copper (Cu), aluminum (Al), or the like.

As illustrated in FIGS. 1 and 2A, the memory cell region MC may include a plurality of cell regions CELL, and the plurality of cell regions CELL may be provided on cell regions 101M of the substrate 101. The substrate 101 may further include connection regions 101D positioned between the plurality of cell regions CELL. Due to the connection regions 101D, the substrate 101 may have a structure connected to the base substrate 201 on an edge of the base substrate 201 in a wafer state during a manufacturing process. This will be described below in further detail with reference to FIGS. 9A and 9B. In a final semiconductor device 100, the connection regions 101D may be disposed in an isolated form between a plurality of adjacent cell regions CELL by the second separation region 170.

The memory cell region MC may include a substrate 101, gate electrodes 130 vertically stacked and spaced apart from each other on the substrate 101, channel structures CH penetrating through a stacked structure of the gate electrodes 130 to vertically extend to an upper surface of the substrate 101, first separation regions 160 penetrating through the stacked structure of the gate electrodes 130 and extending in a y direction, and second separation regions 170 vertically extending to the substrate 101 to penetrate through the substrate 101. The memory cell region MC may further include first and second horizontal conductive layers 104 and 105 disposed on the substrate 101, interlayer insulating layers 120 stacked alternately with the gate electrodes 130, and a cell region insulating layer 190 covering the stacked structure of the gate electrodes 130.

The substrate 101 may have an upper surface extending in the x direction and the y direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as, for example, a polycrystalline silicon layer or an epitaxial layer.

The gate electrodes 130 may be vertically stacked and spaced apart from each other on the substrate 101 to constitute a stacked structure. Among the gate electrodes 130, at least one lowermost gate electrode 130 may be associated with a gate of a ground select transistor, at least one uppermost gate electrode 130 may be associated with a string select transistor, and gate electrodes 130 therebetween may be associated with memory cells. The number of the gate electrodes 130 associated with the memory cells may be determined depending on capacity of the semiconductor device 100. In an example embodiment, one or more gate electrodes 130 that are respectively associated with the string select transistor and the ground select transistor may be provided, and may have the same or different structure as or from the gate electrodes 130 constituting the memory cells. A portion of the gate electrodes 130 may be dummy gate electrodes.

The gate electrodes 130 may be vertically stacked and spaced apart from each other on the substrate 101, and may extend at different lengths in the x and y directions to form a staircase-shaped step. Due to the step, the gate electrodes 130 may provide pad regions in which a lower gate electrode 130 extends further than an upper gate electrode 130 to be exposed upwardly. The gate electrodes 130 may be connected to contact plugs in the pad regions to be connected to overlying interconnection lines.

As illustrated in FIG. 2B, the gate electrodes 130 may be isolated from each other in the x direction by the first separation regions 160 extending in the y direction. The gate electrodes 130 between a pair of first separation regions 160 may be associated with a single memory block, for example. A portion of the gate electrodes 130, for example, the gate electrodes 130 associated with the memory cells, may constitute a single layer in a single memory block.

The gate electrodes 130 may include a metal material, for example, tungsten (W). In an example embodiment, the gate electrodes 130 may include, for example, polycrystalline silicon or a metal silicide material. In an example embodiment, the gate electrodes 130 may further include a diffusion barrier. The diffusion barrier may include, for example, tungsten nitride (WN), tantalum nitride (TaN), titanium nitride (TiN), or combinations thereof.

The interlayer insulating layers 120 may be disposed between the gate electrodes 130. Similarly to the gate electrodes 130, the interlayer insulating layers 120 may be disposed to be spaced apart from each other in a direction perpendicular to an upper surface of the substrate 101. The interlayer insulating layers 120 may include an insulating material such as a silicon oxide or a silicon nitride.

The channel structures CH may each be associated with a single memory cell string, and may be spaced apart from each other while forming a row and a column. The channel structures CH may be arranged to form a grid or may be arranged zigzag in one direction. The channel structures CH may have a pillar shape and may have an inclined side narrowed toward the substrate 101 depending on an aspect ratio. The number of channel structures CH disposed between the pair of first separation regions 160 may be varied.

A channel layer 140 may be disposed in the channel structures CH. In the channel structures CH, the channel layer 140 may be formed to have an annular shape surrounding the channel insulating layer 150 therein. In another example embodiment, the channel layer 140 may have a pillar shape such as a cylindrical or a prismatic shape without the channel insulating layer 150.

The channel layer 140 may be connected to the first horizontal conductive layer 104 in a lower portion. The channel layer 140 may include a semiconductor material such as polycrystalline silicon or single-crystal silicon, and the semiconductor material may be an undoped material or a material including p-type or n-type impurities. The channel structures CH that are disposed on a straight line between the pair of first separation regions 160 in the x direction may be respectively connected to different bitlines depending on the arrangement of an upper interconnection structure connected to the channel pad 155, an additional separation insulating layer, and the like.

In the channel structures CH, channel pads 155 may be disposed on the channel layer 140. The channel pads 155 may be disposed to cover the top surface of the channel insulating layer 150 and to be electrically connected to the channel layer 140. The channel pads 155 may include, for example, doped polycrystalline silicon.

The gate dielectric layer 145 may be disposed between the gate electrodes 130 and the channel layer 140. Although not illustrated in detail, the gate dielectric layer 145 may include a tunneling layer, a charge storage layer, and a blocking layer stacked sequentially from the channel layer 140. The tunneling layer may tunnel charges into the charge storage layer, and may include, for example, a silicon oxide ($SiO_2$), a silicon nitride ($Si_3N_4$), a silicon oxynitride (SiON), or combinations thereof. The charge storage layer may be, for example, a charge trapping layer or a floating gate conductive layer. The blocking layer may include, for example, a silicon oxide ($SiO_2$), a silicon nitride ($Si_3N_4$), a silicon oxynitride (SiON), a high-k dielectric material, or combinations thereof. In an example embodiment, at least a portion of the gate dielectric layer 145 may extend along the gate electrodes 130 in a horizontal direction.

The first and second horizontal conductive layers 104 and 105 may be stacked on the upper surface of the substrate 101. At least a portion of the first and second horizontal conductive layers 104 and 105 may function as a portion of a common source line of the semiconductor device 100, and may function as a common source line together with the substrate 101. The first horizontal conductive layer 104 may be directly connected to the channel layer 140 on the circumference of the channel structures CH. As illustrated in FIG. 3, the first horizontal conductive layer 104 may not extend on the connection regions 101D of the substrate 101, and the second horizontal conductive layer 105 may extend on upper surfaces of the connection regions 101D.

As illustrated in FIG. 2B, in the edge regions of the plurality of cell regions CELL, the first and second horizontal conductive layers 104 and 105 and the substrate 101 may be electrically connected to an overlying interconnection structure by source contact plugs SC disposed on opposite sides of the first separation regions 160. Similarly to the connection regions 101D, in the edge regions, the second horizontal conductive layers 105 may extend longer than the first horizontal conductive layers 104 to be disposed on the substrate 101. The source contact plugs SC may be disposed to be connected to the substrate 101 by penetrating through the second horizontal conductive layers 105 on the substrate 101.

The first and second horizontal conductive layers 104 and 105 may include a semiconductor material, for example, polycrystalline silicon. In this case, at least the first horizontal conductive layer 104 may be a doped layer, and the second horizontal conductive layer 105 may be a doped layer or a layer including impurities diffused from the first horizontal conductive layer 104.

The first separation regions 160 may be disposed to extend through the gate electrodes 130 in the y direction. The first separation regions 160 may be disposed parallel to each other, when viewed from above, as illustrated in FIG. 2B. In an example embodiment, a portion of the first separation regions 160 may intermittently extend when viewed from above, or may only be disposed in a portion. The first separation regions 160 may have a shape in which a width thereof is decreased toward the substrate 101 due to a high aspect ratio. In another implementation, the shape of the first separation regions 160 may have a side surface perpendicular to the upper surface of the substrate 101. The first separation regions 160 may extend to the upper surface of the substrate 101. The first separation regions 160 may include an insulating material such as a silicon oxide, a silicon nitride, or the like.

As illustrated in FIG. 2A, the second separation regions 170 may be disposed in a direction that is perpendicular to the direction in which the connection regions 101D of the substrate 101 extend, and may penetrate through and isolate the connection regions 101D from each other. The second separation regions 170 may have a line shape having a shorter length than the first separation regions 160 when viewed from above, and may be disposed to be longer than the connection regions 101D in the y direction. As illustrated in FIG. 3, the second separation regions 170 may be disposed to sequentially penetrate through the cell region insulating layer 190, the second horizontal conductive layer 105, and the substrate 101 from above. The gate electrodes 130 may be disposed to symmetrically form a step region on opposite sides of the second separation regions 170. Since the second separation regions 170 are disposed on the connection regions 101D in which the gate electrodes 130 do not extend, the second separation regions 170 may be spaced apart from the gate electrodes 130 and may not be disposed to penetrate through the gate electrodes 130.

The second separation regions 170 may include a first region 170U and a second region 170L that vertically overlap. The first region 170U may penetrate through the cell region insulating layer 190, the second horizontal conductive layer 105, and a portion of the substrate 101, and may extend in trench form. The second region 170L may be connected to a lower end of the first region 170U below the first region 170U, and may have a width greater than a width of the first region 170U. A bent portion may be formed at a boundary between the first region 170U and the second region 170L depending on a change in width. The bent portion may be disposed in the substrate 101.

The second region 170L may have a shape expanding from the first region 170U and may have a rounded external surface. In detail, the second region 170L may have an external surface having a shape in which a region, connecting an upper surface, a lower surface, and a side surface, is rounded. The external surface may have a shape formed by, for example, isotropic etching. A lower surface of the second region 170L may be disposed at a level lower than a level of lower surfaces of the first separation regions 160, and may be substantially coplanar with the lower surface of the substrate 101. In another example embodiment, the lower surface of the second region 170L may be disposed below the lower surface of the substrate 101.

As shown in FIG. 3, a second width W2 of an upper end of the second separation region 170 may be greater than a first width W1 of an upper end of the first separation region 160. The second width W2 may range, for example, from about two times to about four times the first width W1, and may range from about 300 nm to about 800 nm.

At a lower end of the first region 170U, the second separation region 170 may have a third width W3 that is smaller than the second width W2.

At a lower end of the second region 170L, the second separation region 170 may have a fourth width W4 that is greater than the second width W2.

The second region 170L may have a first length L1 in the z direction. In an example embodiment, the first length L1 may vary within the scope in which the second separation regions 170 penetrate through the substrate 101.

The second separation regions 170 may be formed of an insulating material, and may be formed of the same material as the first separation regions 160. The second separation regions 170 may include, for example, a silicon oxide, a silicon nitride, or a silicon oxynitride. In an example embodiment, the second separation regions 170 may include a plurality of layers.

The cell region insulating layer 190 may be disposed to cover the substrate 101, the gate electrodes 130 on the substrate 101, and the peripheral region insulating layer 290 in a region in which the substrate 101 is not disposed. The cell region insulating layer 190 may include an insulating material such as a silicon oxide, a silicon nitride, or the like.

Figure 4A:
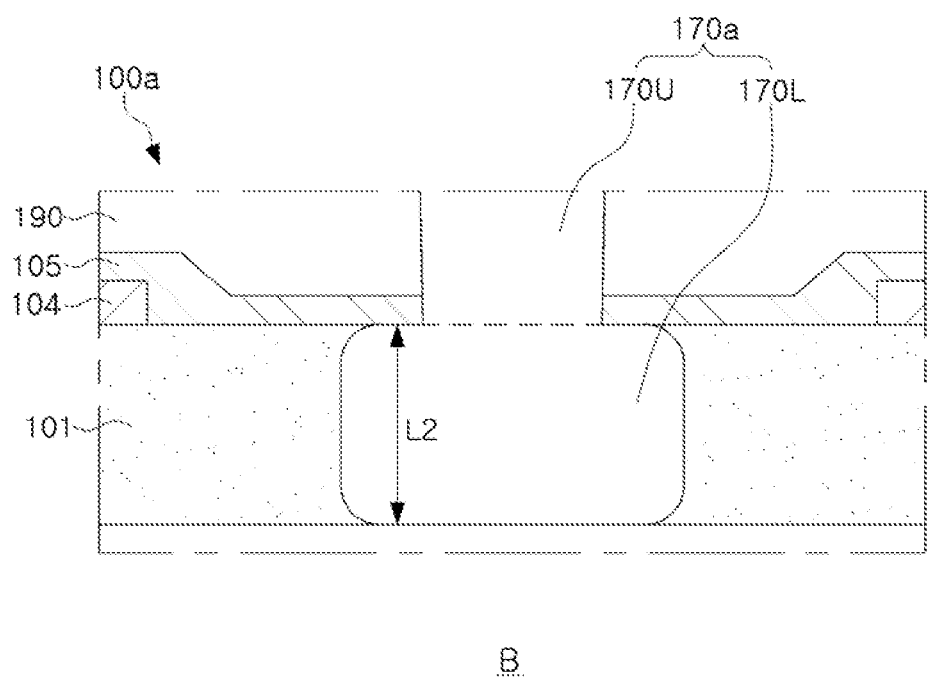
FIGS. 4A to 4C are partially enlarged views of a semiconductor device according to example embodiments.
Figure 4B:
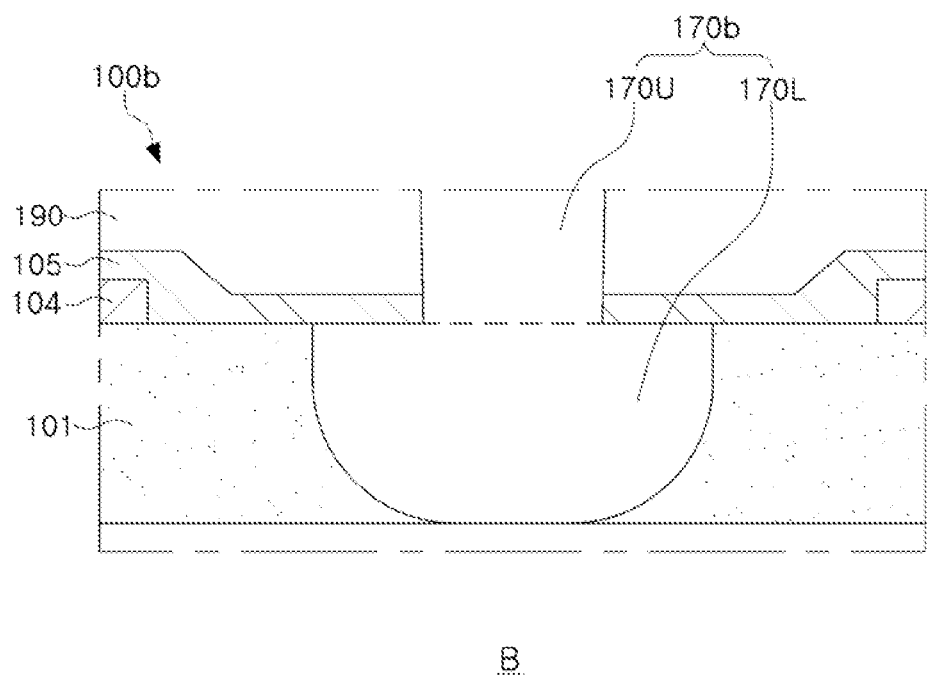
Figure 4C:
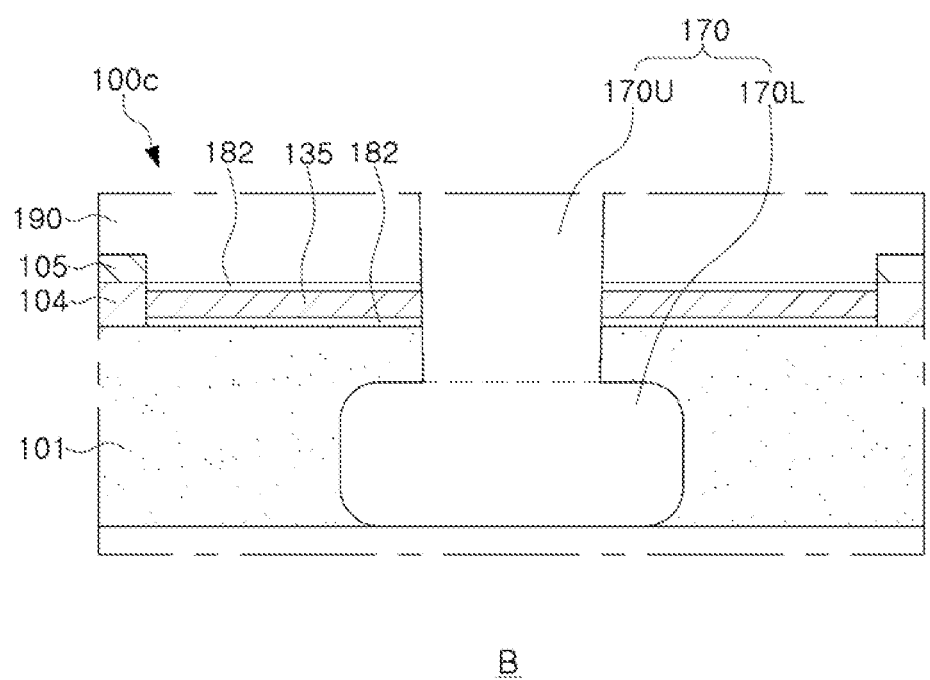

FIGS. 4A to 4C are partially enlarged views of a semiconductor device according to example embodiments. Specifically, FIGS. 4A to 4C are enlarged views of a region corresponding to region 'B' in FIG. 3.

Referring to FIG. 4A, in a semiconductor device 100a according to an example embodiment, a second separation region 170a may include first and second regions 170U and 170L, respectively. The first region 170U of the second separation region 170a may be disposed to only extend to an upper surface of the substrate 101 from above, and a second region 170L of the second separation region 170a may be disposed to penetrate through the substrate 101 from the upper surface to a lower surface of the substrate 101.

The second region 170L may have a second length L2 that is greater than the first length L1 in the example embodiment of FIG. 3 in the z direction, and the second length L2 may be substantially the same as a thickness of the substrate 101. Such a structure may be formed according to an etching amount of the substrate 101 during formation of the second region 170L.

Referring to FIG. 4B, in a semiconductor device 100b according to an example embodiment, a second separation region 170b may include first and second regions 170U and 170L, respectively. The first region 170U of the second separation region 170b may extend to an upper surface of a substrate 101 from above, and the second region 170L may be disposed to penetrate through the substrate 101 from the upper surface to a lower surface of the substrate 101.

As compared to the example embodiment of FIG. 4A, in the second separation region 170b the second region 170L may have a shape in which an upper surface thereof is planar while a side surface and a lower surface thereof are rounded. Such a shape may result from isotropic etching. The second region 170L may be formed to have such a shape, different from the shapes of FIGS. 3 and 4A, according to an etching condition, an etching thickness, and the like.

Referring to FIG. 4C, in a semiconductor device 100c according to an example embodiment, the second separation region 170 may extend to penetrate through the cell region insulating layer 190, first source sacrificial layers 182, and an electrode material layer 135.

In the present example embodiment, the second separation region 170 may be disposed to penetrate through the electrode material layer 135 and the first source sacrificial layers 182 on upper and lower surfaces of the electrode material layer 135, rather than a second horizontal conductive layer 105. Such a structure may be formed when source sacrificial layers 180 are formed without being cut, for example, during a manufacturing process to be described below with reference to FIGS. 8A and 8B.

The first source sacrificial layers 182 may include an insulating material such as a silicon oxide, and the electrode material layer 135 may be formed of the same material as the gate electrodes 130. As described above, the structure, in which the second separation region 170 penetrates through the first source sacrificial layers 182 and the electrode material layer 135, may be applied to other embodiments. In an example embodiment, a structure and a shape of the layers disposed on the upper surface of the substrate 101 on the circumference of the second separation region 170 may be changed in various manners.

Figure 5:
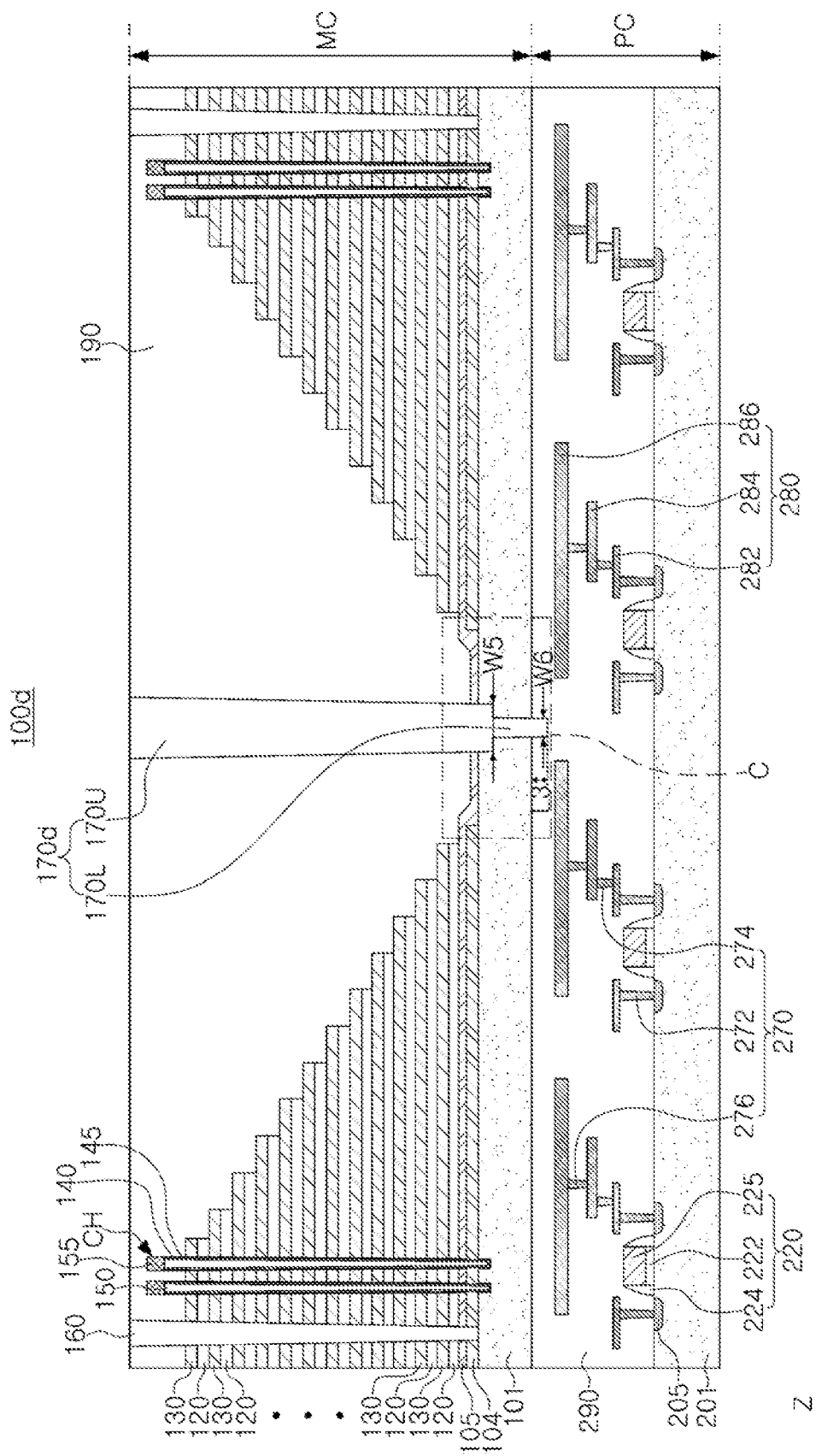
FIG. 5 is a schematic cross-sectional view of a semiconductor device according to an example embodiment.

FIG. 5 is a schematic cross-sectional view of a semiconductor device according to an example embodiment.

Referring to FIG. 5, in a semiconductor device 100d, a second separation region 170d may include the first region 170U and the second region 170L. The first region 170U may penetrate through the cell region insulating layer 190, a the second horizontal conductive layer 105, and a portion of the substrate 101 from above, and may extend in trench form. The second region 170L may be connected to the lower end of the first region 170U below the first region 170U, and have a width less than a width of the first region 170U. A bent portion may be formed on a boundary between the first region 170U and the second region 170L depending on a change in width. The bent portion may be disposed in the substrate 101.

The second region 170L may have a shape contracted from or narrower than the first region 170U with respect to the first region 170U, and may have a relatively small trench shape. The second region 170L may have a shape formed by recessing an underlying peripheral region insulating layer 290. Accordingly, the lower surface of the second region 170L may be disposed to be lower than the lower surface of the substrate 101. A depth L3 of the surface of the second region 170L, recessed from the lower surface of the substrate 101, may be changed in example embodiments.

A width of the upper end of the second region 170L and a sixth width W6, which is a minimum width of the second region 170L, may be less than a fifth width W5 at the lower end of the first region 170U, which is a minimum width of the first region 170U. The sixth width W6 may, for example, range from about 50 nm to about 200 nm.

Figure 6:
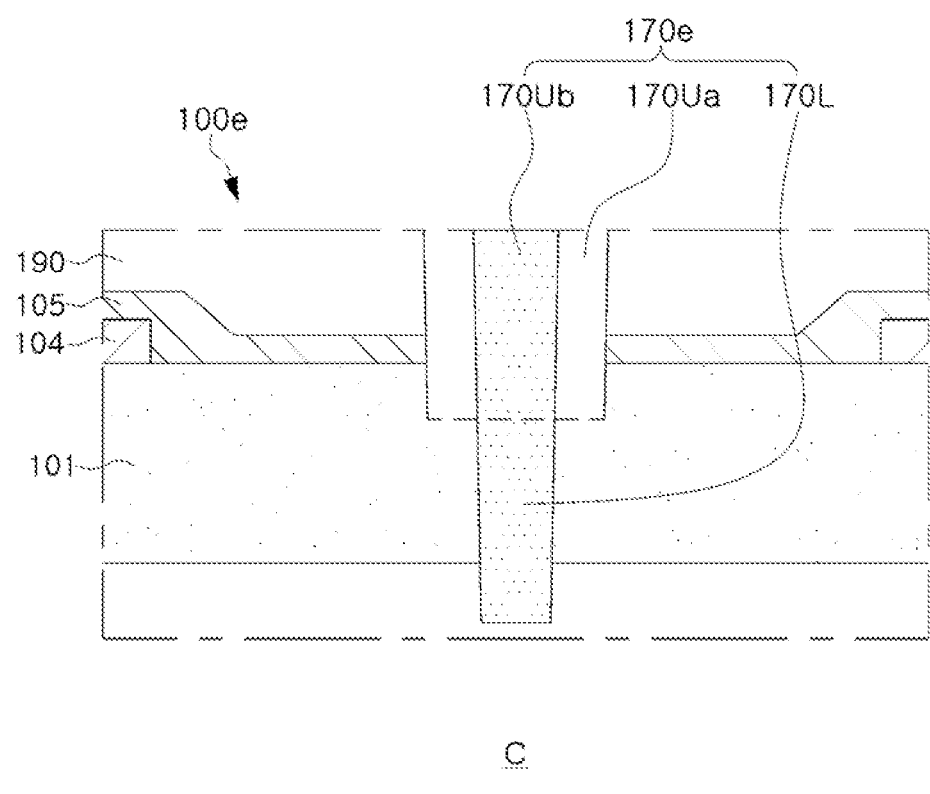
FIG. 6 is a partially enlarged view of a semiconductor device according to an example embodiment.

FIG. 6 is a partially enlarged view of a semiconductor device according to an example embodiment. Specifically, FIG. 6 is an enlarged view of a region corresponding to region 'C' in FIG. 5.

Referring to FIG. 6, in a semiconductor device 100e, first regions 170Ua and 170Ub of a second separation region 170e may include a plurality of layers. The first regions 170Ua and 170Ub may include an external region 170Ua and an internal region 170Ub, and the internal region 170Ub may have a shape connected to the second region 170L. For example, the internal region 170Ub and the second region 170L may be formed of the same material, and the internal region 170Ub and the external region 170Ua may be formed of the same material or different materials.

Figure 7A:
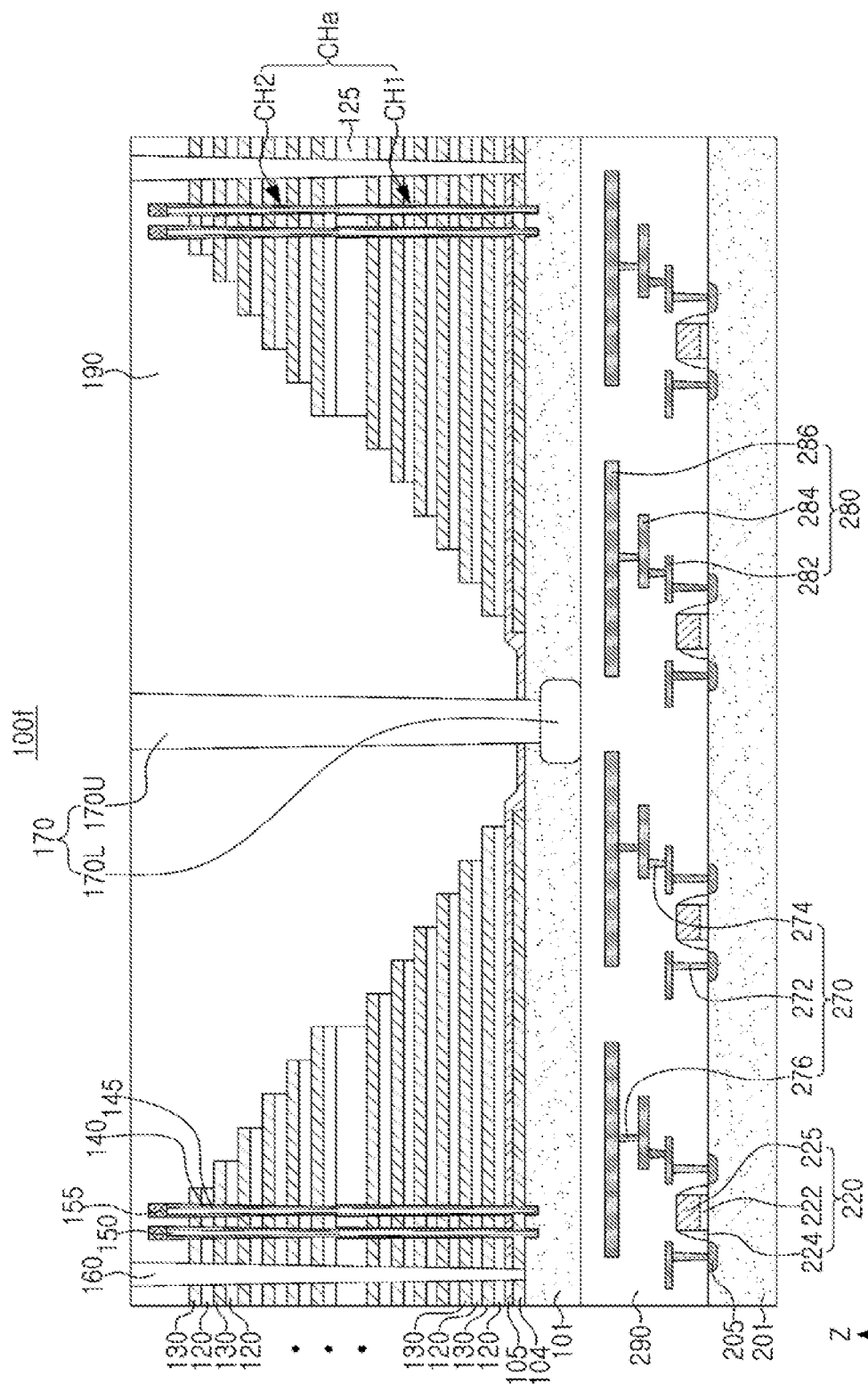
FIGS. 7A and 7B are schematic cross-sectional views of a semiconductor device according to an example embodiment.
Figure 7B:
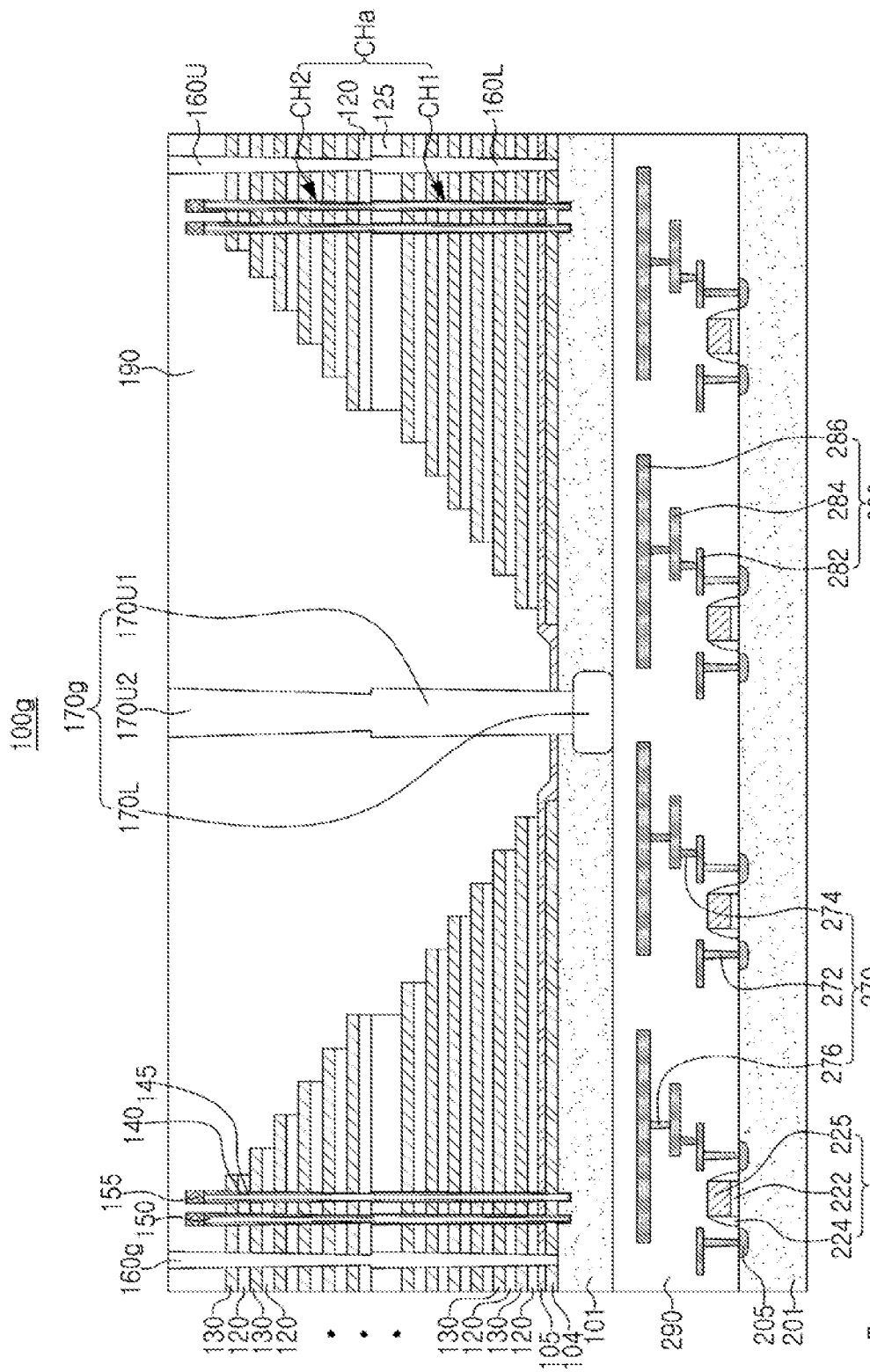

FIGS. 7A and 7B are schematic cross-sectional views of a semiconductor device according to an example embodiment.

Referring to FIG. 7A, in a semiconductor device 100f according to an example embodiment, a stacked structure of gate electrodes 130 may include lower and upper stacked structures stacked vertically, and channel structures CHa may include first and second channel structures CH1 and CH2 stacked vertically. Such a structure of the channel structures CHa may be introduced to stably form the channel structures CHa when the number of stacked gate electrodes 130 is relatively great.

The channel structure CHa may have a shape in which an underlying first channel structure CH1 and an overlying second channel structure CH2 are connected to each other, and may have a bent portion formed due to a difference in width in the connection region.

A channel layer 140, a gate dielectric layer 145, and a channel insulating layer 150 may be connected to each other between the first channel structure CH1 and the second channel structure CH2. The channel pad 155 may be disposed only on an upper end of the underlying second channel structure CH2. In another example embodiment, each of the first channel structure CH1 and the second channel structure CH2 may include a channel pad 155, in which case the channel pad 155 of the first channel structure CH1 may be connected to the channel layer 140 of the second channel structure CH2.

An upper interlayer insulating layer 125 having a relatively large thickness may be disposed on an uppermost portion of the lower stacked structure. The shapes of the interlayer insulating layers 120 and the upper interlayer insulating layer 125 may be changed in example embodiments.

The first and second separation regions 160, 170 may be disposed to penetrate through both the upper and lower stacked structures. Accordingly, the above descriptions, made with reference to FIGS. 1 to 3, may be identically applied to the shape and the structure of the first separation regions 160 and the second separation region 170.

Referring to FIG. 7B, in a semiconductor device 100g according to an example embodiment, the channel structures CHa may have a structure in which the first and second channel structures CH1 and CH2 are stacked in the same manner as in FIG. 7A. Additionally, in this embodiment, first separation regions 160g and a second separation region 170g may also have a structure in which a region in the lower stacked structure and a region in the upper stacked structure are vertically disposed.

For example, in the second separation region 170g, first regions 170U1 and 170U2 may have a structure in which two trench-type regions are vertically connected to each other and may be connected to the second region 170L on a lower end. The second separation region 170g may have a first bent portion, formed due to a difference in width, in a connection region between the two first regions 170U1 and 170U2, and may also have a second bent portion, formed due to a difference in width, between the first regions 170U1 and 170U2 and the second region 170L.

FIGS. 8A to 16B are schematic cross-sectional views illustrating stages in a method of manufacturing a semiconductor device according to an example embodiment. In FIGS. 8A to 16B, regions corresponding to the regions illustrated in FIGS. 2A and 3 are illustrated.

Figure 8A:
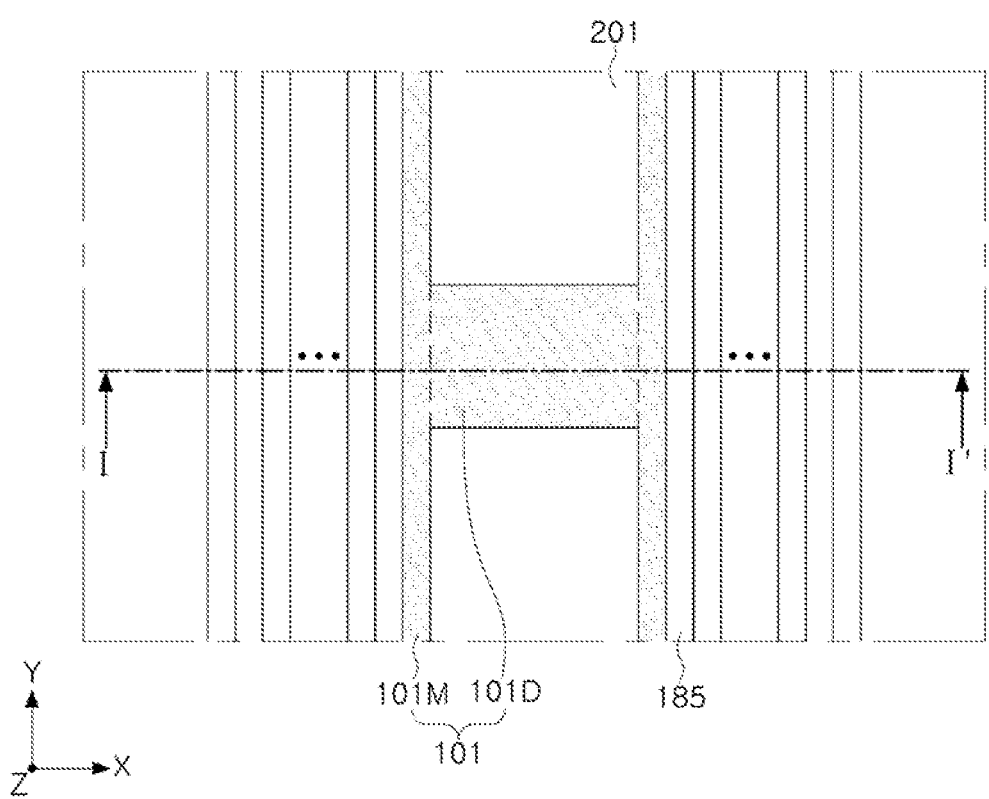
FIGS. 8A to 16B are schematic cross-sectional views illustrating stages in a method of manufacturing a semiconductor device according to an example embodiment.
Figure 8B:
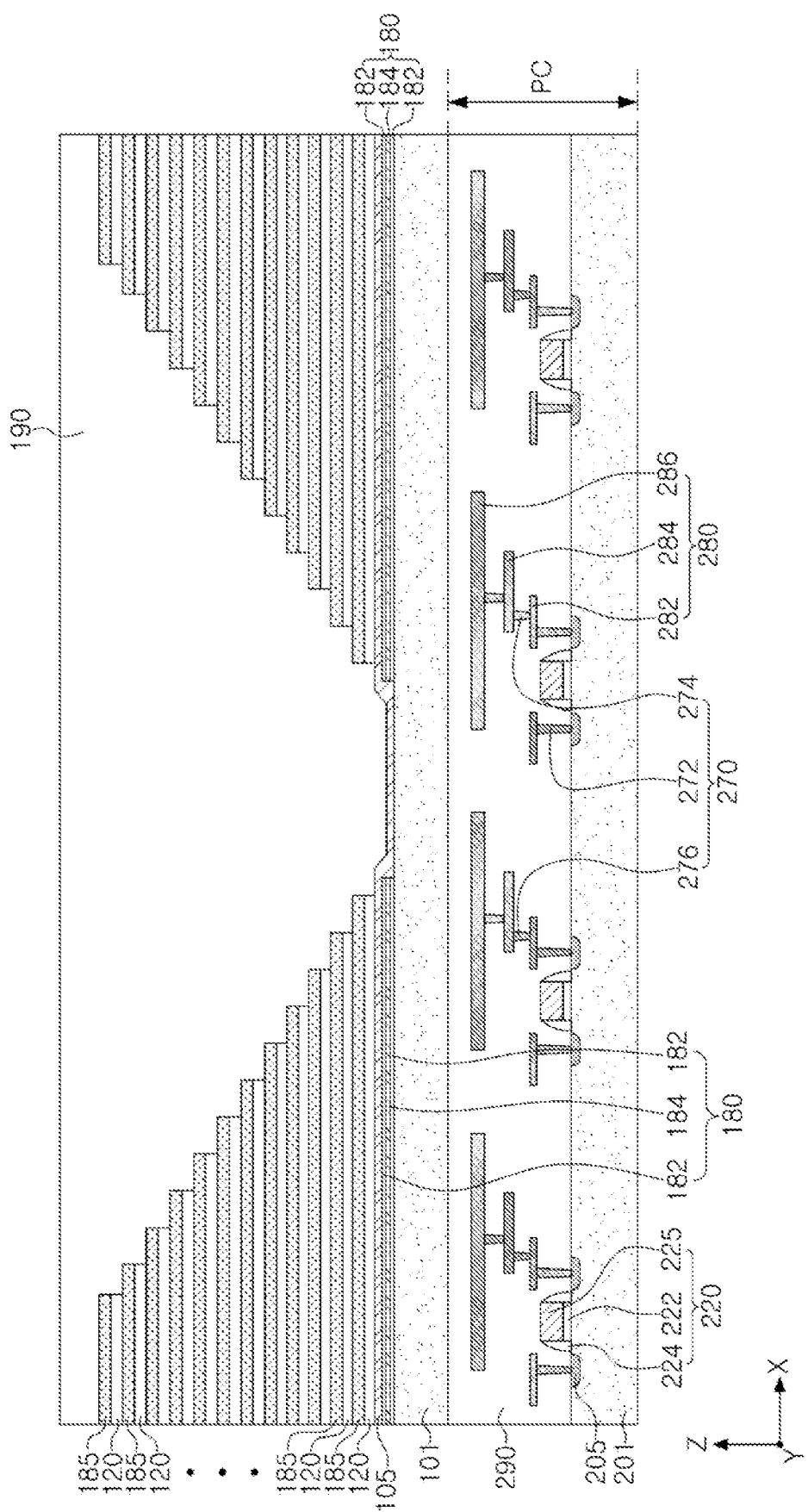

Referring to FIGS. 8A and 8B, a peripheral circuit region PC including circuit elements 220 and the interconnection structures may be formed on a base substrate 201, a substrate 101 provided with a memory cell region may be formed on an upper portion of the peripheral circuit region PC, and then source sacrificial layers 180 may be formed and horizontal sacrificial layers 185 and interlayer insulating layers 120 may be alternately stacked.

A circuit gate dielectric layer 222 and a circuit gate electrode 225 may be sequentially formed on the base substrate 201. The circuit gate dielectric layer 222 and the circuit gate electrode 225 may be formed using, for example, atomic layer deposition (ALD) or chemical vapor deposition (CVD). The circuit gate dielectric layer 222 may be formed of, for example, a silicon oxide, and the circuit gate electrode 225 may be formed of, for example, at least one of polycrystalline silicon and a metal silicide. Spacer layers 224 may be formed on opposite sidewalls of the circuit gate dielectric layer 222 and the circuit gate electrode 225. In an example embodiment, the spacer layer 224 may include a plurality of layers. An ion implantation process may be performed to form source/drain regions 205 in the base substrate 201.

Circuit contact plugs 270 may be formed by forming a portion of a peripheral region insulating layer 290, etching and removing a portion of the peripheral circuit insulating layer 290, and filling the removed portion with a conductive material. Circuit interconnection lines 280 may be formed by, for example, depositing a conductive material and patterning the deposited conductive material.

The peripheral region insulating layer 290 may include a plurality of insulating layers. A portion of the peripheral region insulating layer 290 may be formed in respective processes of forming interconnection structures including the circuit contact plugs 270 and the circuit interconnection lines 280, and a portion of the peripheral region insulating layer 290 may be formed on an upper portion of a third circuit interconnection line 286, an uppermost interconnection line. Ultimately, the peripheral region insulating layer 290 may be formed to cover the circuit elements 220 and the interconnection structures.

The substrate 101 may be formed on the peripheral region insulating layer 290. The substrate 101 may be formed of, for example, polycrystalline silicon and may be formed by a CVD process. The polycrystalline silicon constituting the substrate 101 may include impurities. The substrate 101 may be patterned to have a size smaller than a size of the base substrate 201 illustrated in FIG. 1.

The source sacrificial layers 180 may include first and second source sacrificial layers 182 and 184, and may be stacked on the substrate 101 such that first source sacrificial layers 182 are disposed above and below the second source sacrificial layer 184. The first and second source sacrificial layers 182 and 184 may include different materials to each other. The first and second source sacrificial layers 182 and 184 may be layers replaced with the first horizontal conductive layer 104 in FIG. 3 through a subsequent process. The first source sacrificial layer 182 may be formed of the same material as the interlayer insulating layers 120, and the second source sacrificial layer 184 may be formed of the same material as the horizontal sacrificial layers 185. The second horizontal conductive layer 105 may be deposited on the source sacrificial layers 180, and may be formed to be in contact with an upper surface of the substrate 101 in a region in which the source sacrificial layers 180 are not disposed.

As illustrated in FIG. 8B, in a region in which the second separation region 170 (see FIG. 3) is to be formed, the source sacrificial layers 180 may not be disposed on the substrate 101. Locations of edges of the source sacrificial layers 180 may be varied relative to those illustrated in the drawings.

The horizontal sacrificial layers 185 may be layers having portions replaced with gate electrodes 130 (see FIG. 3) through a subsequent process. The horizontal sacrificial layers 185 may be formed of a material different from a material of the interlayer insulating layers 120, and may be formed of a material having an etching selectivity, capable of being etched under specific etching conditions. For example, the interlayer insulating layer 120 may be formed of at least one of a silicon oxide and a silicon nitride, and the horizontal sacrificial layers 185 may be formed of a material, selected from silicon, a silicon oxide, a silicon carbide, and a silicon nitride, different from the material of interlayer insulating layer 120.

In an example embodiment, thicknesses of the interlayer insulating layers 120 and the horizontal sacrificial layers 185 and the numbers of layers constituting the same may vary, as illustrated in the drawings. In the region illustrated in FIG. 8B, a photolithography process and an etching process may be repeatedly performed on the horizontal sacrificial layers 185 using a mask layer such that an overlying horizontal sacrificial layers 185 may extend less than the underlying horizontal sacrificial layers 185. As a result, the horizontal sacrificial layers 185 may have a staircase shape.

A cell region insulating layer 190 may be formed to cover an upper portion of the stacked structure of the horizontal sacrificial layers 185 and the interlayer insulating layers 120.

Figure 9A:
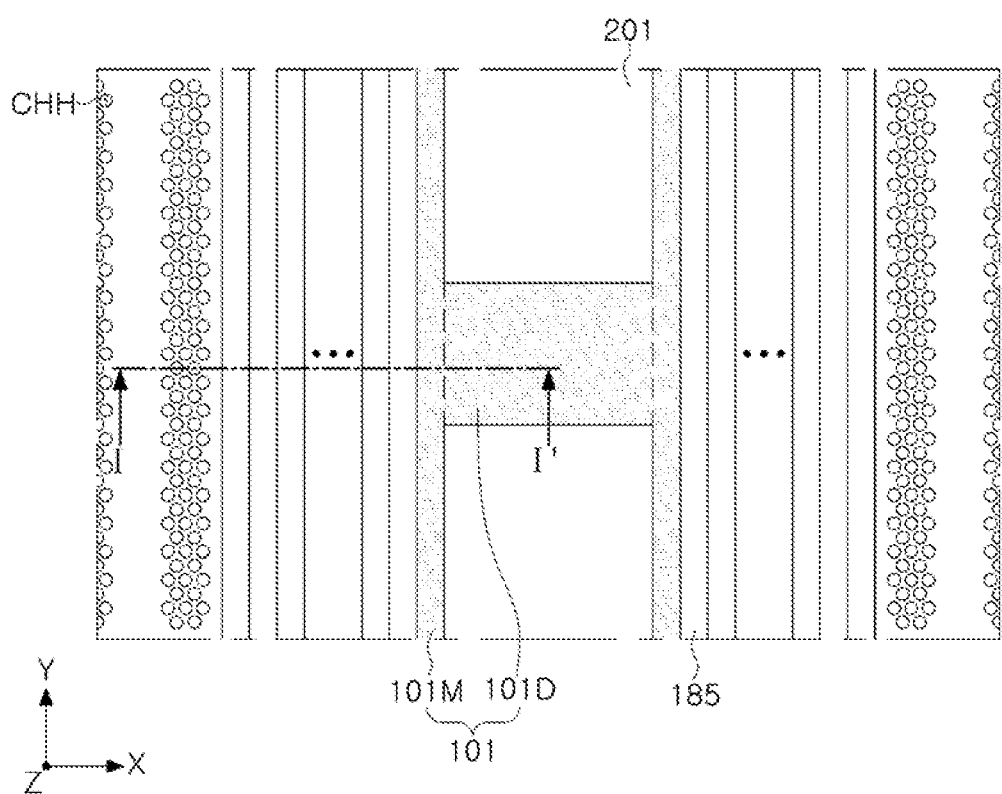
Figure 9B:
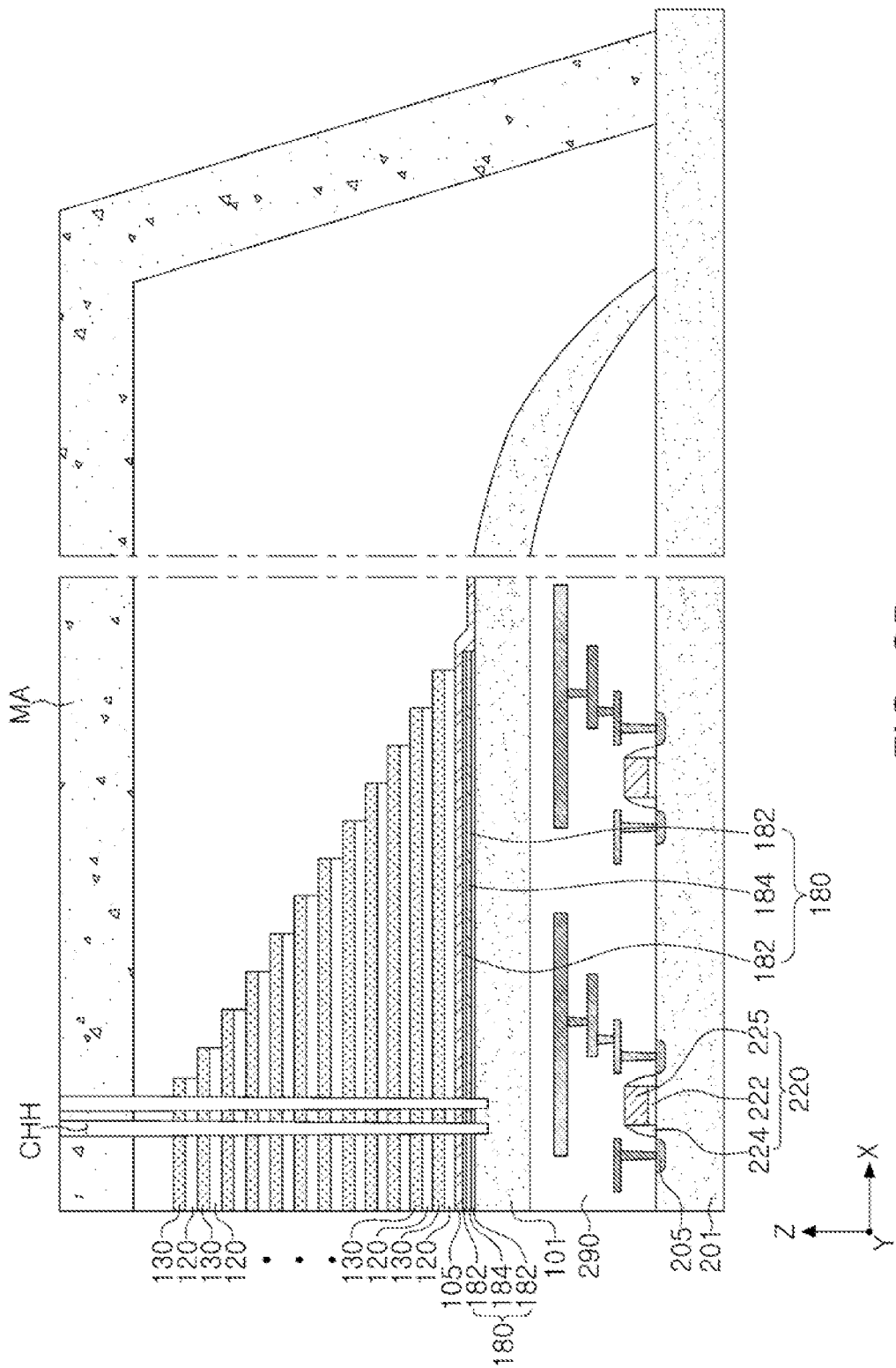

Referring to FIGS. 9A and 9B, channel holes CHH may be formed to penetrate through the stacked structure of the horizontal sacrificial layers 185 and the interlayer insulating layers 120. In FIG. 9B, a partial region corresponding to a left region in FIG. 3 is illustrated together with an edge of the base substrate 201.

In order to form the channel holes CHH, a mask layer MA including an amorphous carbon layer (ACL) may be formed on a cell region insulating layer 190. A mask layer MA may cover upper and side surfaces of the cell region insulating layer 190 in an edge region of the base substrate 201 and may extend on the base substrate 201. In the edge region of the base substrate 201 in the form of a wafer, for example, a scribe region, the substrate 101 may have a curved structure and be connected to the base substrate 201.

Each of the channel holes CHH may have a hole shape and may be formed by, for example, an anisotropic etching process. Depending on a height of the stacked structure, sidewalls of the channel holes CHH may not be perpendicular to an upper surface of the substrate 101. The channel holes CHH may be formed to recess a portion of the substrate 101.

When a plasma dry etching process is used during formation of the channel holes CHH, a potential difference or electrical potential may occur or develop in upper and lower portions of the channel holes CHH by ions generated in the channel holes CHH. In an example embodiment, the substrate 101 is connected to the base substrate 201 in the edge region while they are connected to each other by the connection regions 101D, allowing charges to be dissipated, for example, allowing cations to flow to the base substrate 201 through the substrate 101 and allowing anions to flow to the base substrate 201 through the mask layer MA. Thus, an arcing fault may be prevented from occurring as a result of the potential difference.

Figure 10A:
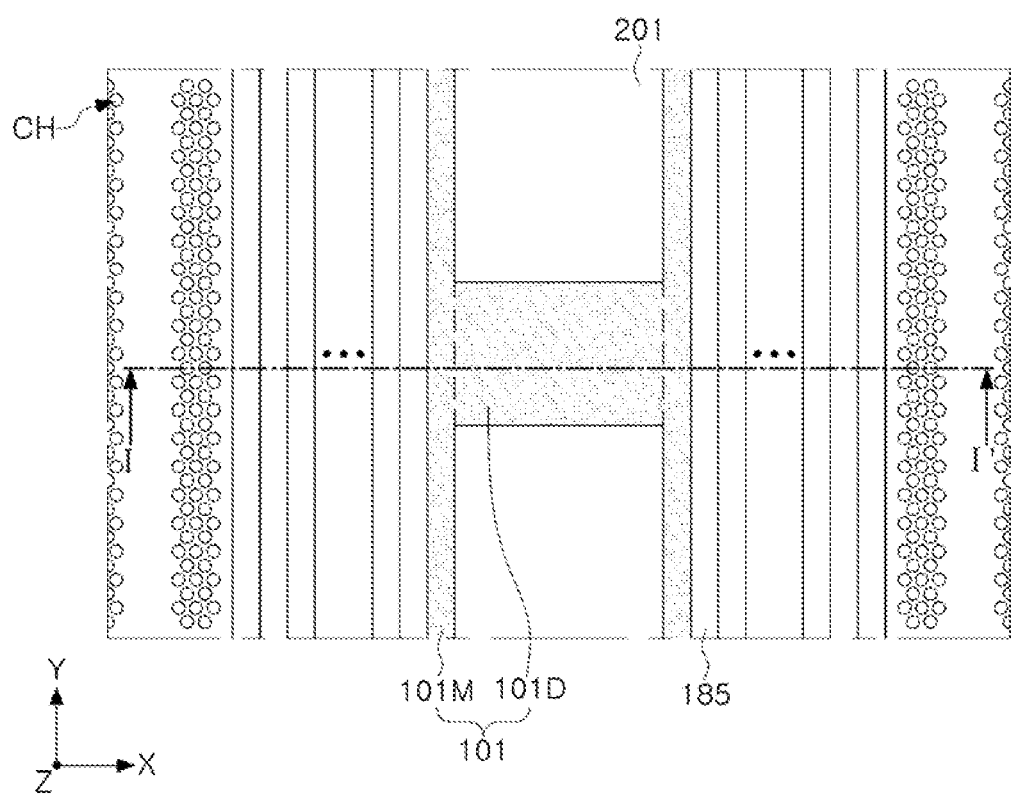
Figure 10B:
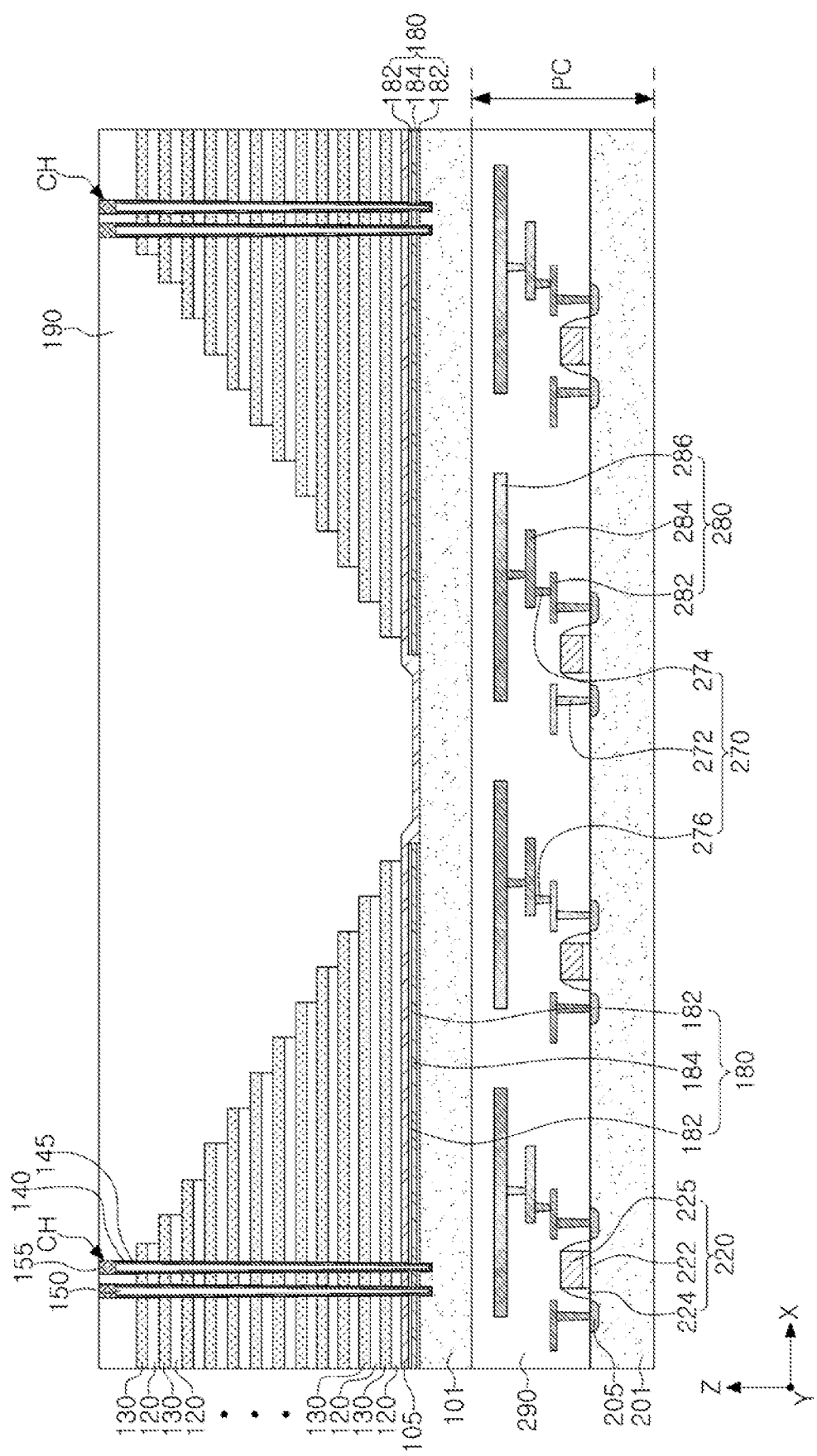

Referring to FIGS. 10A and 10B, at least a portion of a gate dielectric layer 145, a channel layer 140, a channel insulating layer 150, and channel pads 155 may be sequentially formed in the channel holes CHH to form channel structures CH.

The gate dielectric layer 145 may be formed to have a uniform thickness using, for example, an ALD or CVD process. In this case, all or a portion of the gate dielectric layer 145 may be formed and a portion, vertically extending to the substrate 101 along the channel structures CH, may be formed. The channel layer 140 may be formed on the gate dielectric layer 145 in the channel structures CH. The channel insulating layer 150 may be formed to fill the channel structures CH, and may include an insulating material. In an example embodiment, an inside of the channel layer 140 may be filled with a conductive material rather than the channel insulating layer 150. A channel pad 155 may be formed of a conductive material, for example, polycrystalline silicon.

Figure 11A:
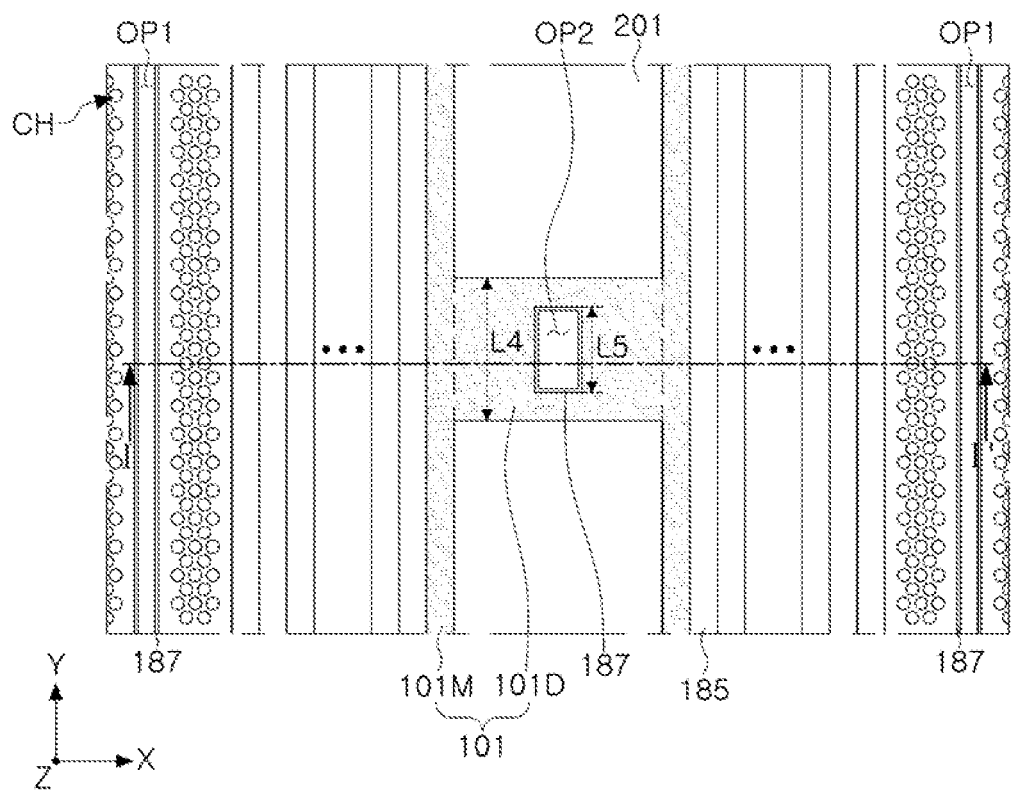
Figure 11B:
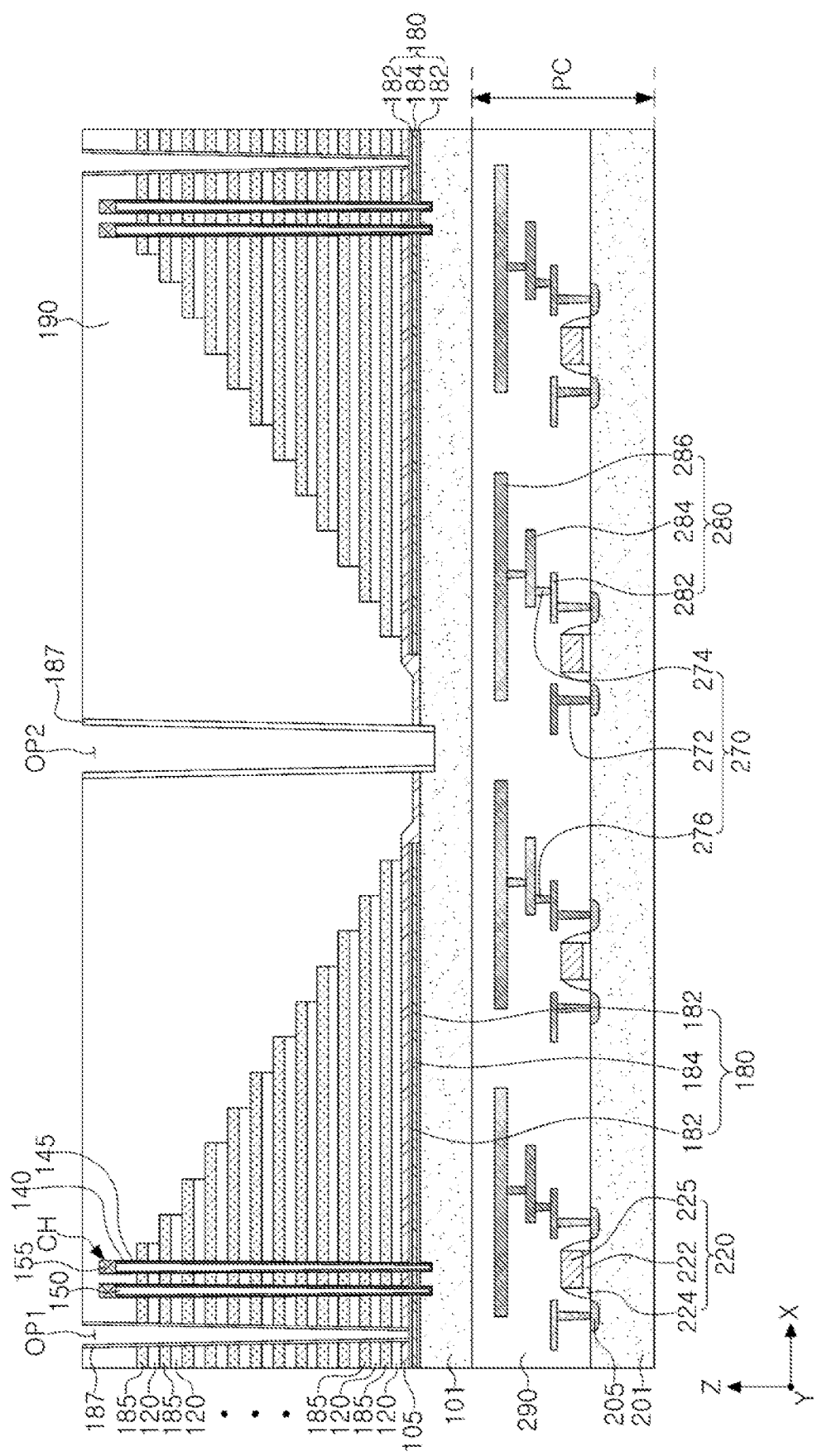

Referring to FIGS. 11A and 11B, first and second openings OP1 and OP2 may be formed to penetrate through the stacked structure of the horizontal sacrificial layers 185 and the interlayer insulating layers 120. Sacrificial spacer layers 187 may be formed on internal sidewalls of the first and second openings OP1 and OP2.

Prior to formation of the first and second openings OP1 and OP2, a cell region insulating layer 190 may be further formed on the channel structures CH. The first openings OP1 may be formed in locations of the first separation regions 160 in FIG. 3, and the second openings OP2 may be formed in locations of the second separation regions 170. The first and second openings OP1 and OP2 may be simultaneously formed by forming a mask layer using a photolithography process and anisotropically etching the stacked structure using a dry etching process. In this case, as described above with reference to FIGS. 9A and 9B, the substrates 101 may be connected to the base substrate 201 in the edge region while they are connected to each other by the connection regions 101D, and thus, an arcing fault may be prevented from occurring.

The first openings OP1 may be formed in the form of a trench extending in the y direction, and the second openings OP2 may be formed in the form of a relatively short and wide rectangular trench. The source sacrificial layers 180 may be exposed below the first openings OP1, and the second opening OP2 may extend inwardly of the substrate 101 to expose the substrate 101 therebelow.

When the first and second openings OP1 and OP2 are formed together in the same process, they may be formed to have different depths to each other by adjusting process conditions such that a minimum width of the second opening OP2 is equal to about twice or more of a minimum width of the first opening OP1. The second opening OP2 may have a width greater than a width of the first openings OP1. Thus, an etching rate of the second opening OP2 may be relatively high, and thus, the second opening OP2 may be deeply etched.

As illustrated in FIG. 11A, the second opening OP2 may be formed in the y direction to have a length L5 that is less than a length L4 of a connection region 101D of the substrate 101. If the length L5 of the second opening OP2 is equal to the length L4 of the connection region 101D, the second opening OP2 may extend downwardly while recessing the underlying peripheral region insulating layer 290 outside of the connection region 101D, due to a process deviation, which may cause difficulty in controlling a depth of the second opening OP2.

The sacrificial spacer layers 187 may be formed on internal sidewalls of the first and second openings OP1 and OP2 and may include a material different from a material of the source sacrificial layers 180. The sacrificial spacer layers 187 may protect the horizontal sacrificial layers 185 in a subsequent process.

Figure 12A:
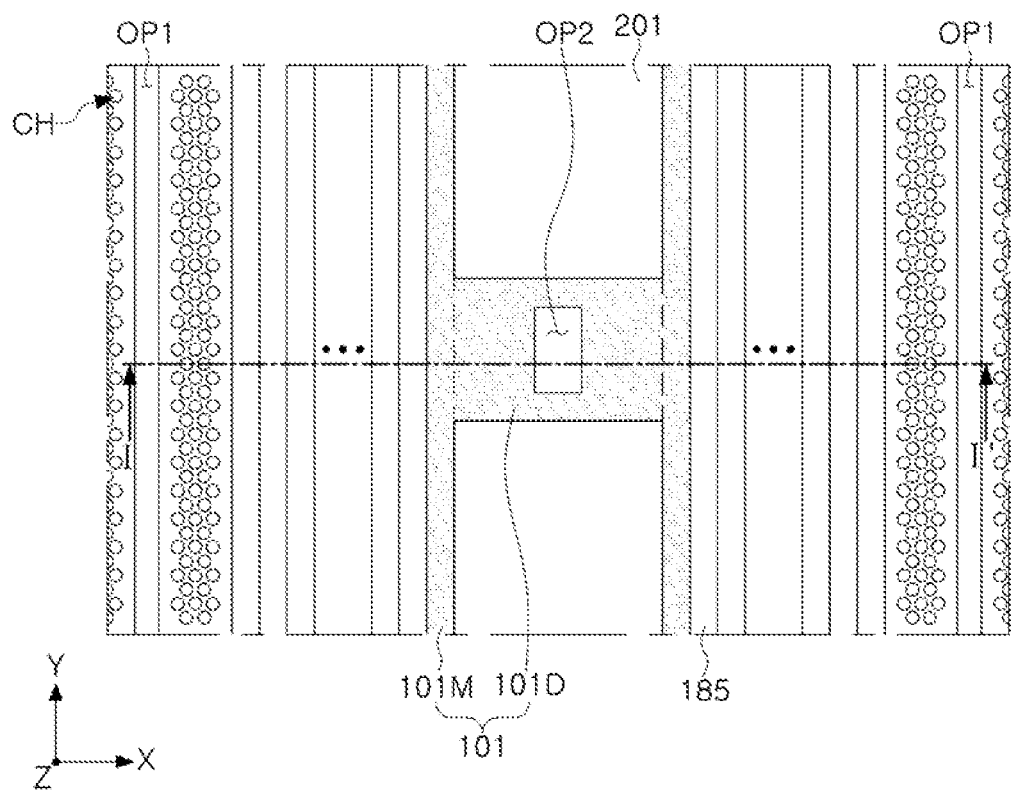
Figure 12B:
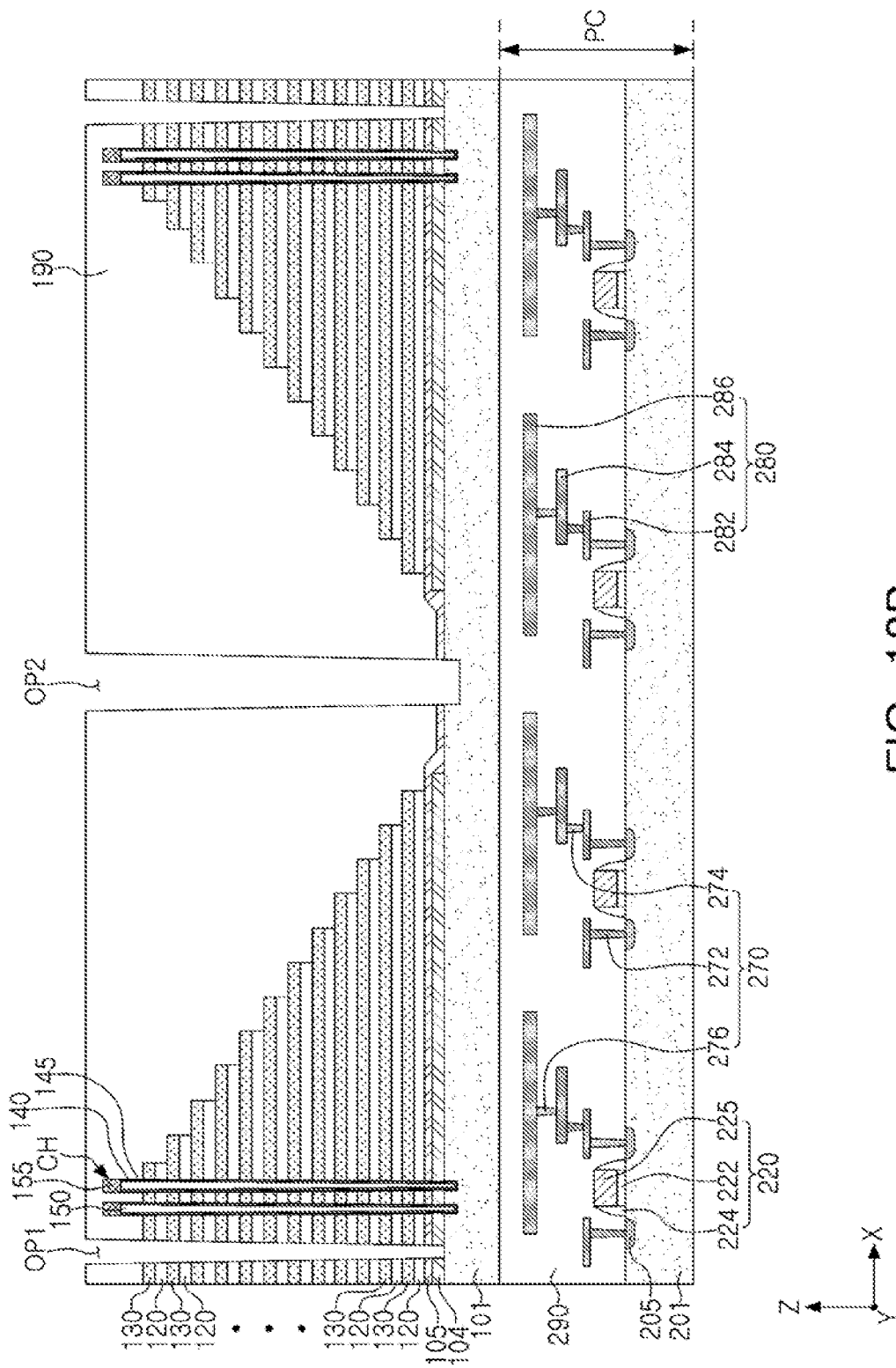

Referring to FIGS. 12A and 12B, the source sacrificial layers 180 may be removed through the first openings OP1, and a first horizontal conductive layer 104 may be formed in a region in which the source sacrificial layers 180 are removed.

After the second source sacrificial layer 184 is selectively removed through the first openings OP1, the first source sacrificial layers 182 may be removed. The source sacrificial layers 180 may be removed by, for example, a wet etching process. In the process of removing the first source sacrificial layers 182, a portion of the gate dielectric layer 145, exposed in a region in which the second source sacrificial layer 184 is removed, may also be removed.

After a first horizontal conductive layer 104 is formed by depositing a conductive material on a region in which the source sacrificial layers 180 are removed, the sacrificial layers 187 in the first and second openings OP1 and OP2 may be removed. The first horizontal conductive layer 104 may be in direct contact with the channel layer 140 in the region in which the gate dielectric layer 145 is removed.

Figure 13A:
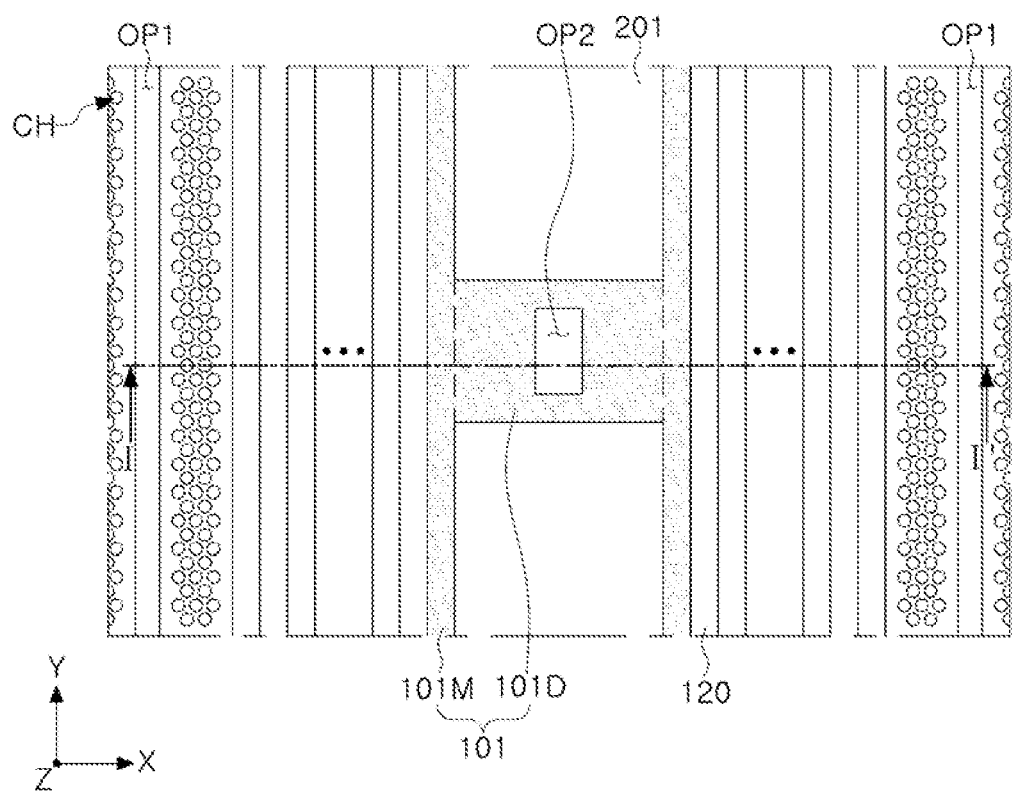
Figure 13B:
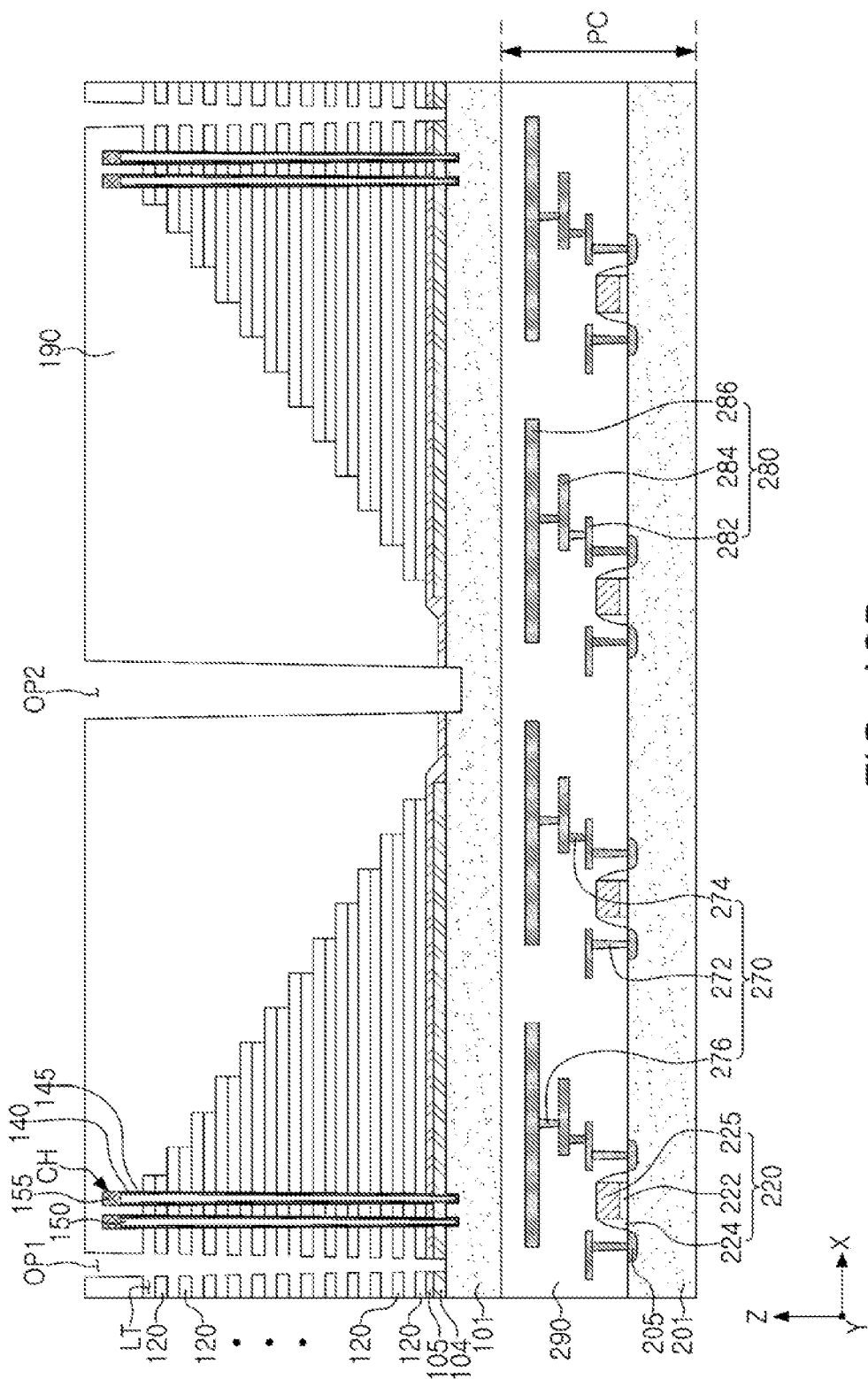

Referring to FIGS. 13A and 13B, the horizontal sacrificial layers 185 may be removed through the first openings OP1 to form lateral openings LT.

The horizontal sacrificial layers 185 may be selectively removed with respect to the interlayer insulating layers 120 and the first and second horizontal conductive layers 104 and 105 using, for example, wet etching. Accordingly, a plurality of the lateral openings LT may be formed between the interlayer insulating layers 120, and a portion of sidewalls of the channel structures CH may be exposed through the lateral openings LT.

Figure 14A:
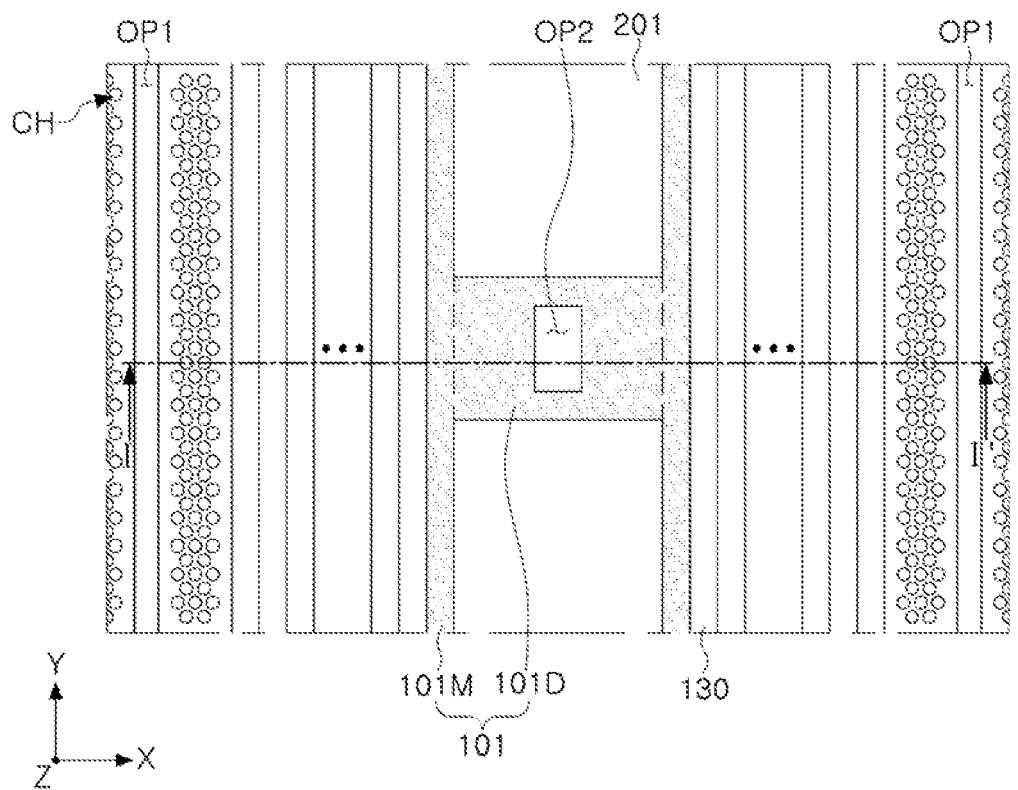
Figure 14B:
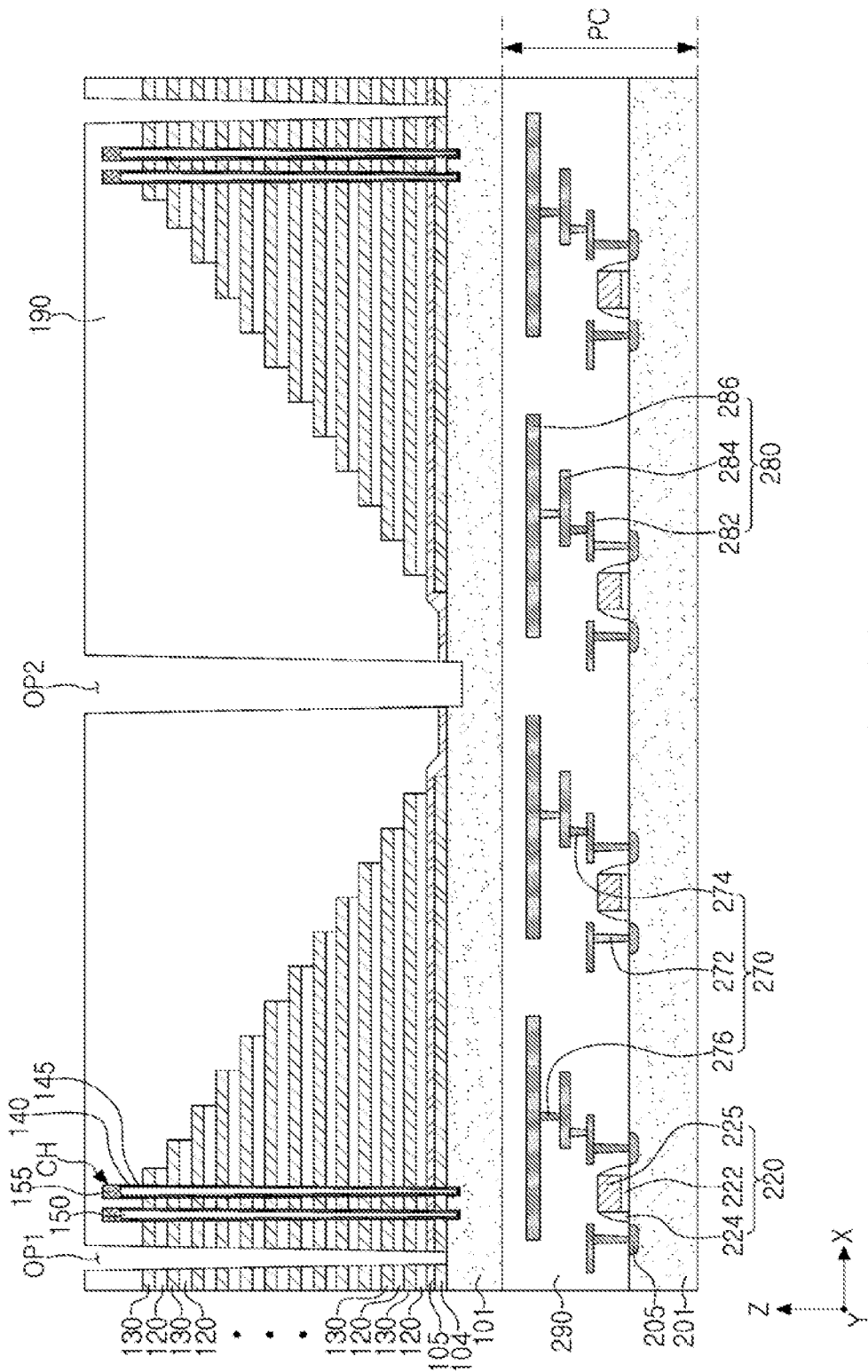

Referring to FIGS. 14A and 14B, the lateral openings LT may be filled with a conductive material to form gate electrodes 130. The conductive material that constitutes the gate electrodes 130 may fill the lateral openings LT. The conductive material may include, for example, a metal, polycrystalline silicon, or a metal silicide material. After the gate electrodes 130 are formed, the conductive material deposited in the first and second openings OP1 and OP2 may be removed through an additional process.

Figure 15A:
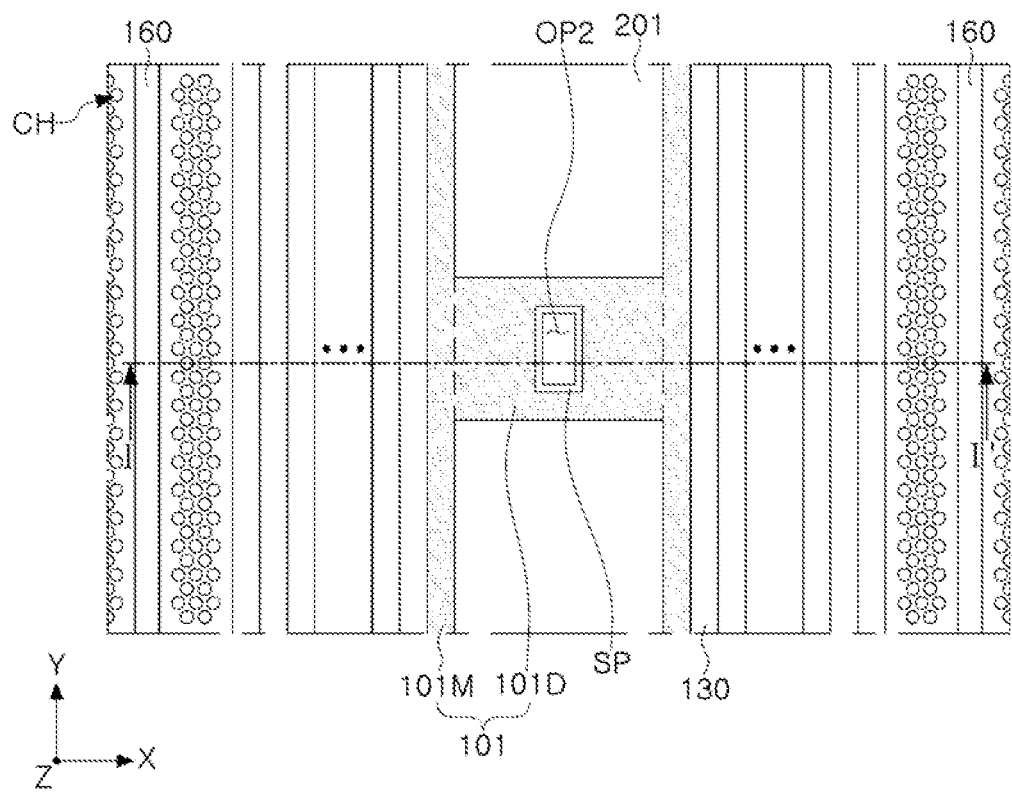
Figure 15B:
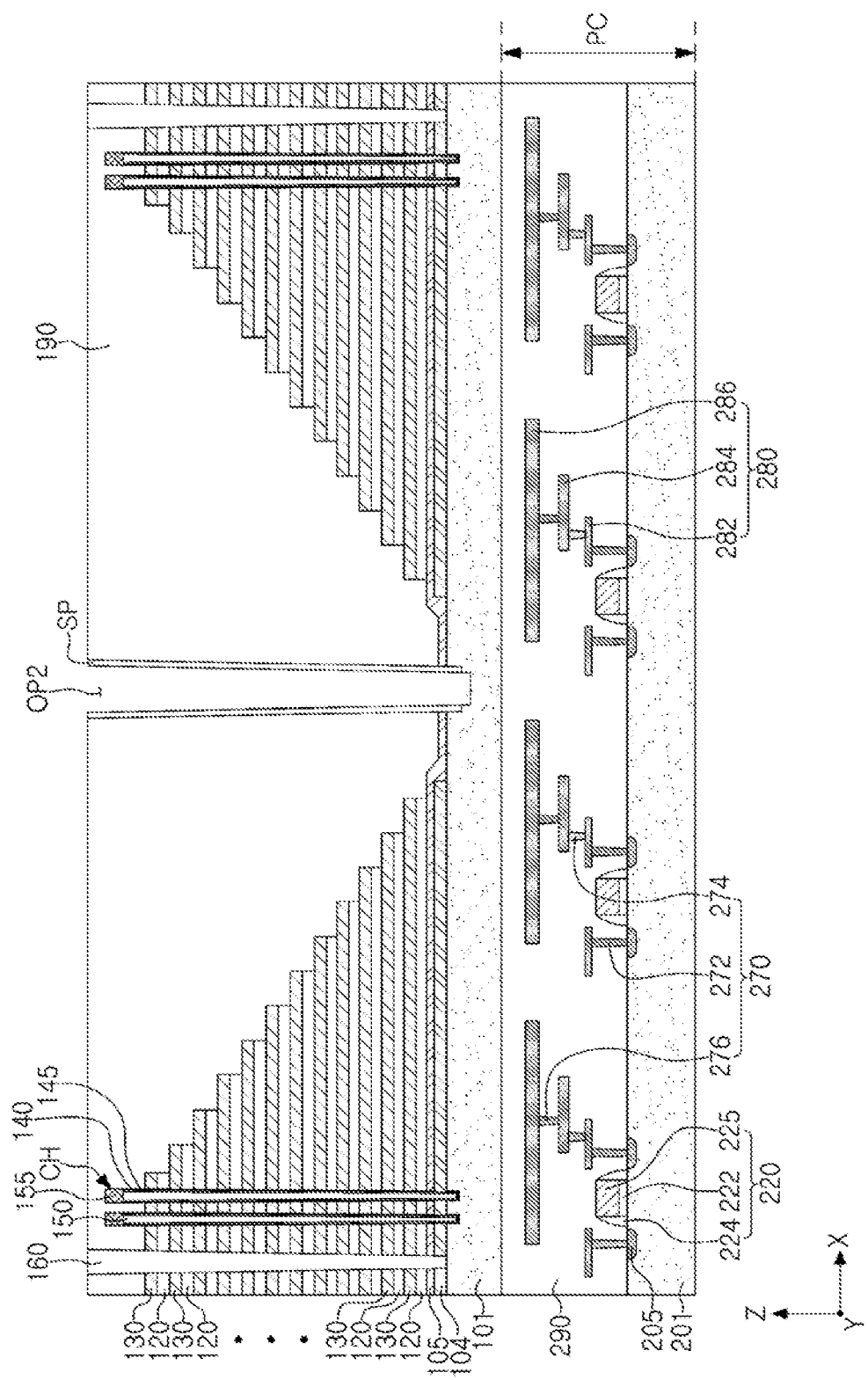

Referring to FIGS. 15A and 15B, an insulating material may be deposited in the first and second openings OP1 and OP2 to form first separation regions 160 and a separation spacer layer SP. Due to a difference in width between the first and second openings OP1 and OP2, the insulating material may completely fill the first openings OP1 to form first separation regions 160 in the first openings OP1, while being deposited on internal sidewalls of the second opening OP2.

By controlling etching conditions and distribution of an etchant, the insulating material deposited on a lower end of the second opening OP2 may be removed while protecting upper ends of the first separation regions 160. Thus, a separation spacer layer SP may be formed. As illustrated in FIG. 15B, in this case, the second opening OP2 may extend downwardly, such that the lower end of the second opening OP2 may be disposed to be lower than a lower surface of the separation spacer layer SP.

Figure 16A:
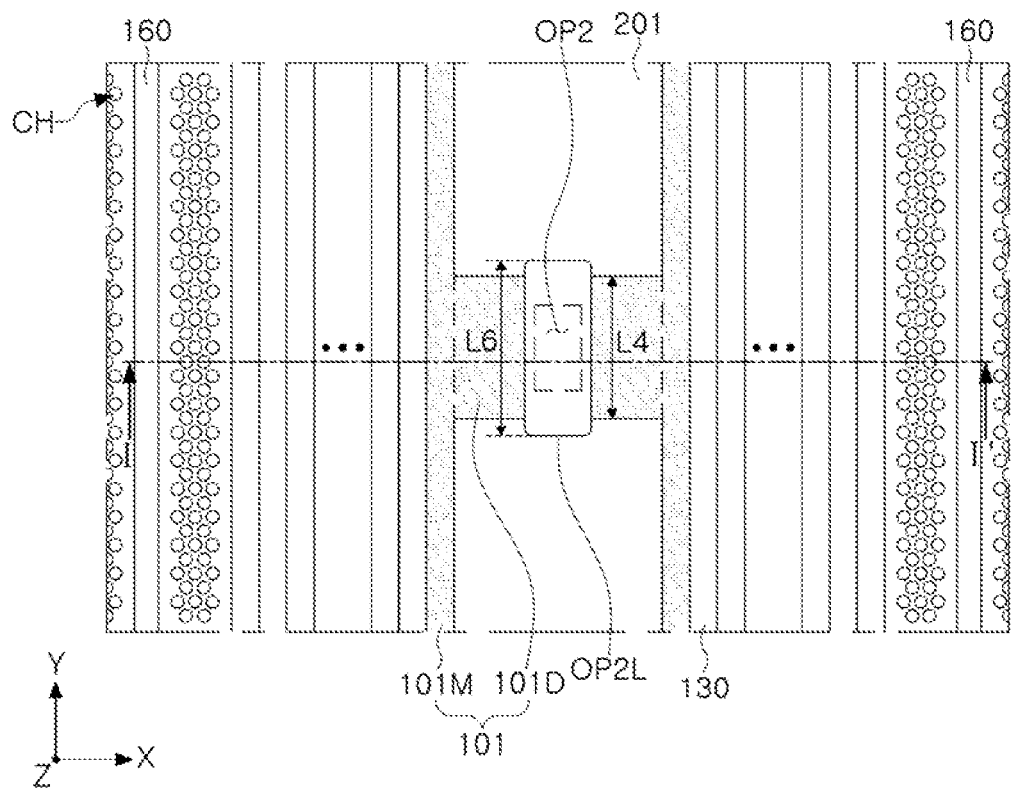
Figure 16B:
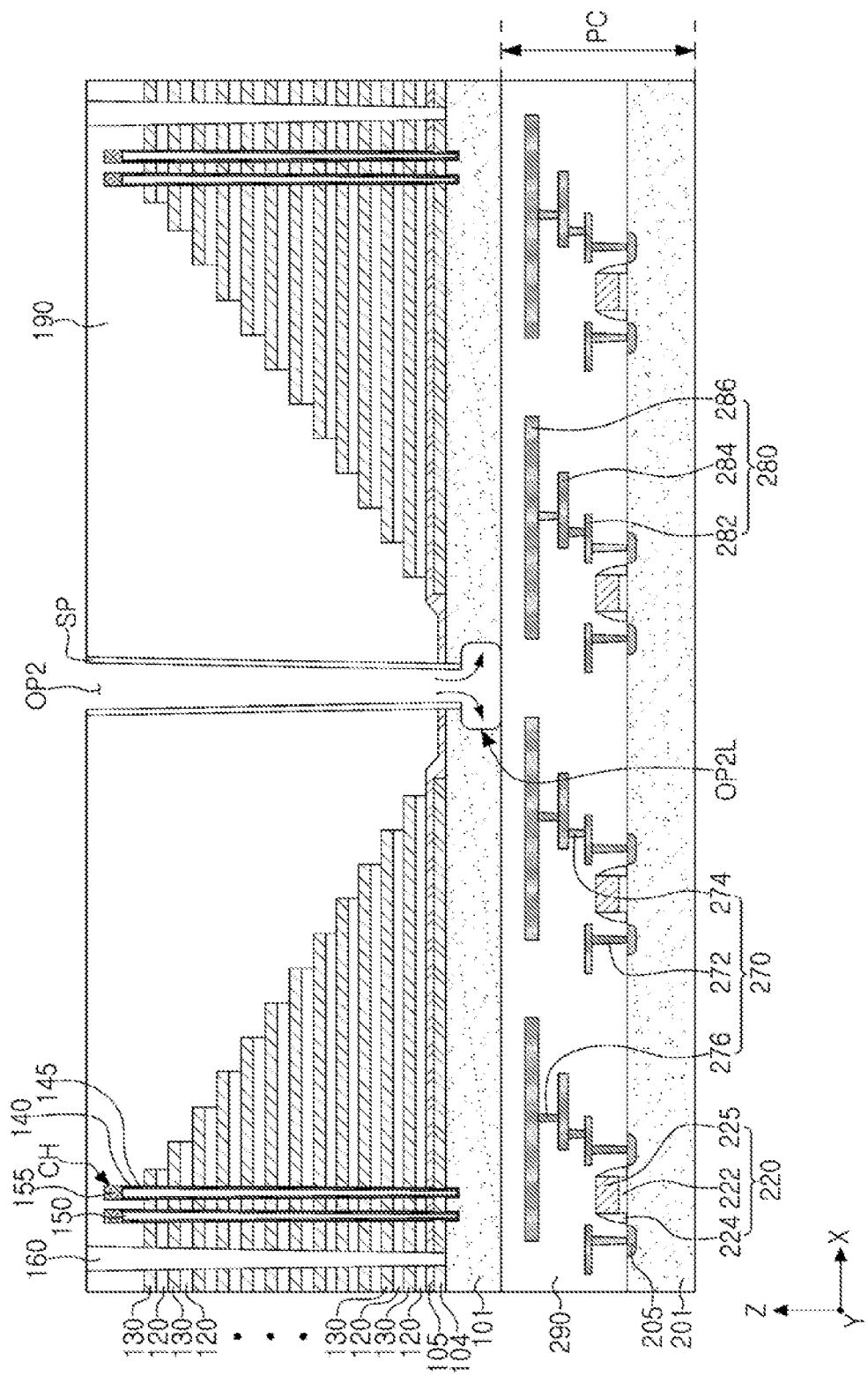

Referring to FIGS. 16A and 16B, the substrate 101 exposed on the lower end of the second opening OP2 may be removed to form a second opening extension OP2L.

The substrate 101 may be removed on the lower end of the second opening OP2 by a wet etching process, and the underlying peripheral region insulating layer 290 may be exposed through the second opening OP2. The etchant may be provided to the substrate 101 through the second opening OP2. The etching process may be selectively performed on the material of the substrate 101. Thus, the separation spacer layer SP may remain without being removed.

A second opening extension OP2L may have an external surface rounded according to an isotropic etching process. As illustrated in FIG. 16A, the second opening extension OP2L may extend from the second opening OP2 in the x direction and the y direction. Accordingly, the second opening extension OP2L may have a length L6 greater than a length L4 of the connection region 101D of the substrate 101 in the y direction, and a connection region 101D may be completely cut in a direction perpendicular to an extension direction. As a result, the substrate 101 may be divided between a plurality of cell regions CELL.

Next, referring again to FIG. 3, an insulating material may be deposited in the second opening OP2 and the second opening extension OP2L to form a second separation region 170. In an example embodiment, when the insulating material includes a material different from a material of the separation spacer layer SP, a boundary thereof may be recognized in the second separation region 170.

As described above, the second separation region 170 may be formed using a process of forming the first separation regions 160. Accordingly, the second separation region 170 may be formed without adding a photolithography process, the substrate 101 may be divided into a plurality of cell regions CELL after formation of the channel holes CHH and the first and second openings OP1 and OP2, and an arcing fault may be prevented.

Figure 17A:
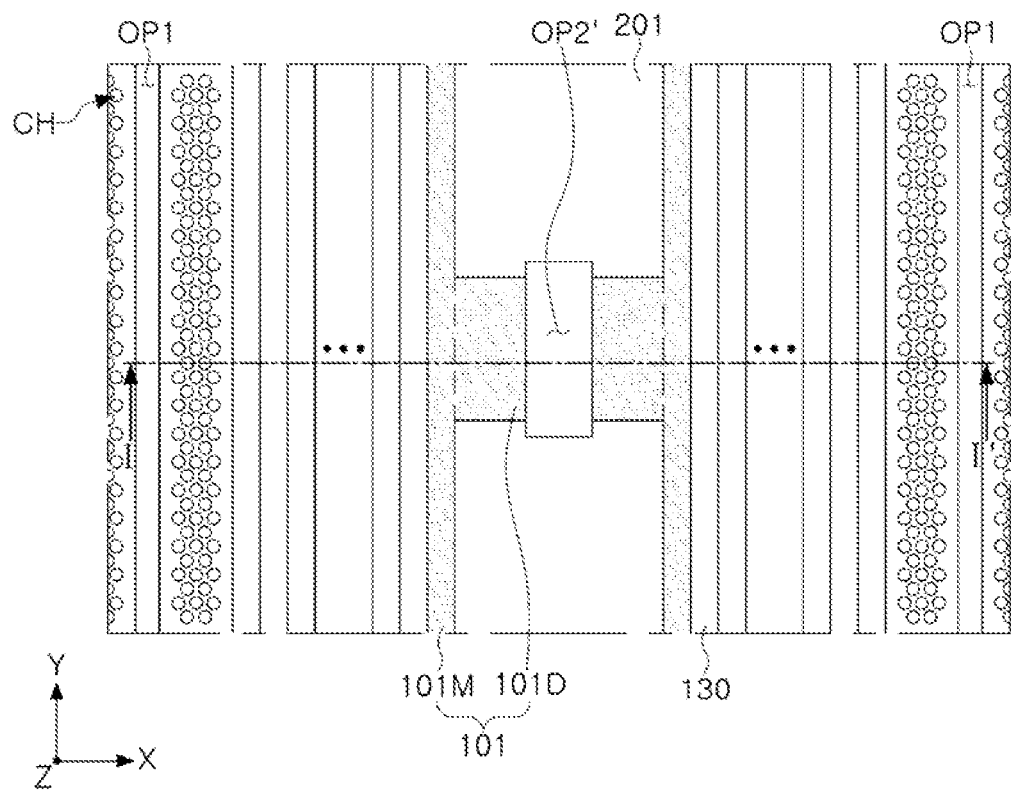
FIGS. 17A to 18B are schematic cross-sectional views illustrating stages in a method of manufacturing a semiconductor device according to an example embodiment.
Figure 17B:
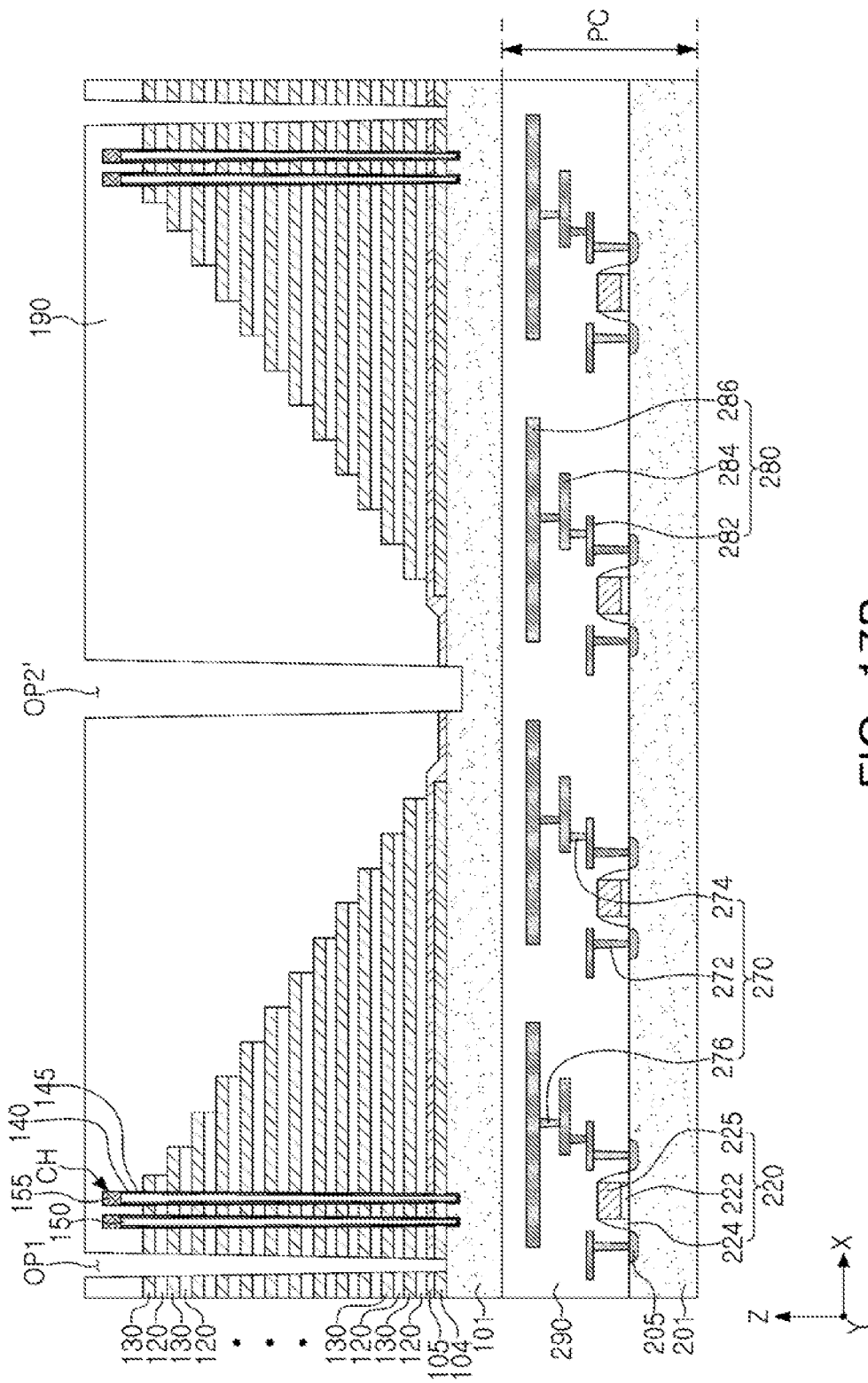
Figure 18A:
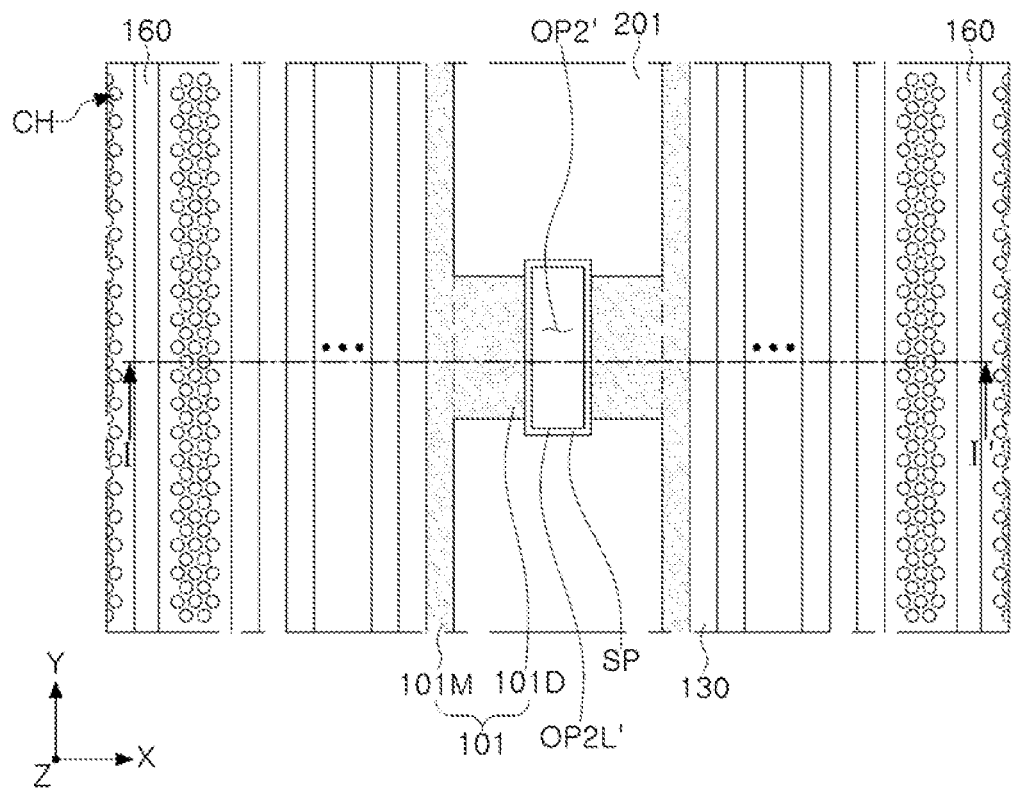
Figure 18B:
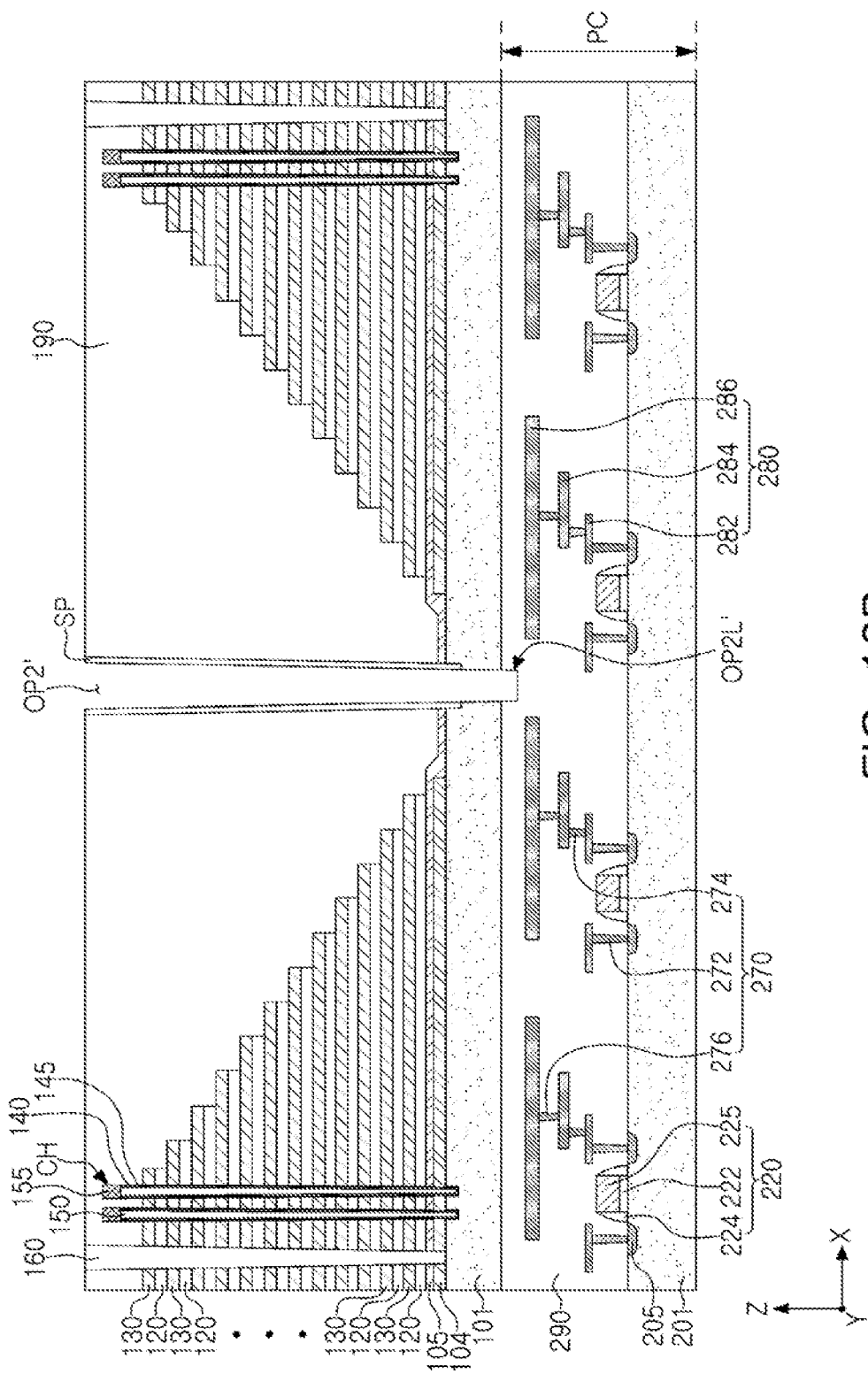

FIGS. 17A to 18B are schematic cross-sectional views illustrating stages in a method of manufacturing a semiconductor device according to an example embodiment. In FIGS. 17A and 18B, regions corresponding to the regions illustrated in FIGS. 2A and 5 are illustrated.

Referring to FIGS. 17A and 17B, the processes described above with reference to FIGS. 8A to 14B may be performed in the same manner, while, in this embodiment, when the processes are performed, a second opening OPT may be formed in the y direction to be longer than a connection region 101D of a substrate 101 in the y direction, as illustrated in FIG. 17A.

Referring to FIGS. 18A and 18B, an insulating material may be deposited in the first and second openings OP1 and OPT to form a first separation regions 160 and a separation spacer layer SP, and the substrate 101 exposed on the lower end of the second opening OPT may be removed to form a second opening extension OP2L'.

The first separation regions 160 and the separation spacer layer SP may be formed in the same manner as described with reference to FIGS. 15A and 15B. A second opening extension OP2L' may be formed by anisotropically etching the substrate 101 on the lower end of the second opening OPT using a dry etching process. Thus, the second opening extension OP2L' may be contracted from the overlying second opening OPT to have a shape similar to a shape of the second opening OPT.

The second opening extension OP2L' may be formed by contracting from the second opening OPT by thicknesses of the separation spacer layer SP in the x direction and the y direction. The second opening extension OP2L' may be formed to divide the substrates 101 between the plurality of cell regions CELL.

Next, referring again to FIG. 5, an insulating material may be deposited on the second opening OPT and the second opening extension OP2L' to form a second separation region 170d. The second separation region 170d may be formed using a process of forming the first separation regions 160. Thus, the second separation region 170d be formed without adding a photolithography process, and the substrate may be divided into the plurality of cells CELL, after formation of the channel holes CHH and the first and second openings OP1' and OP2', to prevent an arcing fault.

As described above, a separation region that penetrates through a substrate provided with a memory cell region may be formed to have a bent portion.

As described above, example embodiments may provide a semiconductor device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a peripheral circuit region including a first substrate and circuit elements on the first substrate; and
a memory cell region including a second substrate on an upper portion of the first substrate, gate electrodes spaced apart from each other and vertically stacked on the second substrate, a horizontal conductive layer between the second substrate and the gate electrodes, channel structures extending vertically through the gate electrodes to the second substrate, first separation regions penetrating through the gate electrodes between the channel structures and extending in one direction, a cell region insulating layer covering a stacked structure of the gate electrode, and a second separation region extending vertically to penetrate through the second substrate from above,
wherein the second separation region includes a first region extending inwardly of the second substrate from above in trench form and a second region connected to a lower end of the first region within the second substrate, the second region having a width greater than a width of the first region and having a rounded external surface.

2. The semiconductor device as claimed in claim 1, wherein the second separation region penetrates through the cell region insulating layer and the horizontal conductive layer from above, and extends to the second substrate.

3. The semiconductor device as claimed in claim 1, wherein each of the first separation regions has a first width at an upper end of the first separation region, and the second separation region has a second width, greater than the first width, at an upper end of the second separation region.

4. The semiconductor device as claimed in claim 3, wherein the second width ranges from about two times to about four times the first width.

5. The semiconductor device as claimed in claim 4, wherein the second width ranges from about 300 nm to about 800 nm.

6. The semiconductor device as claimed in claim 1, wherein the second separation region has a second width at an upper end of the first region, a third width less than the second width at a lower end of the first region, and a fourth width greater than the second width at a lower end of the second region.

7. The semiconductor device as claimed in claim 1, wherein the second separation region has a lower surface substantially coplanar with a lower surface of the second substrate.

8. The semiconductor device as claimed in claim 1, wherein the first separation regions have lower surfaces disposed at a level higher than a lower surface of the first region.

9. The semiconductor device as claimed in claim 1, wherein the first separation regions and the second separation region are formed of an insulating material.

10. The semiconductor device as claimed in claim 1, wherein:
the memory cell region includes a plurality of cell regions,
the second substrate includes a connection region extending between cell regions that are adjacent to each other in one direction, and
the second separation region penetrates through the connection region to divide the second substrate between the plurality of the cell regions.

11. The semiconductor device as claimed in claim 10, wherein:
the gate electrodes are disposed within the plurality of cells regions such that the gate electrodes do not extend to the connection region, and
the second separation region does not penetrate through the gate electrodes.

12. The semiconductor device as claimed in claim 10, wherein the memory cell region further includes source contact plugs disposed outside of the first separation regions in edge regions of the plurality of cell regions, the source contact plugs being electrically connected to the second substrate.

13. The semiconductor device as claimed in claim 1, wherein the horizontal conductive layer includes first and second conductive layers that are vertically stacked.

14. The semiconductor device as claimed in claim 1, wherein the channel structures include first and second channel structures vertically stacked on the second substrate.

15. The semiconductor device as claimed in claim 14, wherein the first region of the second separation region includes two regions vertically stacked on the second substrate.

16. A semiconductor device, comprising:
a peripheral circuit region including a first substrate and circuit elements on the first substrate; and
a memory cell region including a second substrate on an upper portion of the first substrate, gate electrodes spaced apart from each other and vertically stacked on the second substrate, channel structures extending vertically through the gate electrodes to the second substrate, first separation regions penetrating through the gate electrodes between the channel structures and extending in one direction, and a second separation region extending vertically to penetrate through the second substrate from above and having a bent portion due to a change in width,
wherein the second separation region includes a first region extending from above in trench form, and a second region connected to a lower end of the first region, being in the second substrate, having a width greater than a width of the first region, and having a rounded external surface.

17. The semiconductor device as claimed in claim 16, wherein the bent portion of the second separation region is disposed in the second substrate.

18. A semiconductor device, comprising:
a first substrate;
circuit elements on the first substrate;
a first insulating layer covering the circuit elements;
a second substrate disposed on the first insulating layer;
gate electrodes spaced apart from each other and vertically stacked on the second substrate;
a second insulating layer covering the gate electrodes; and
a separation region spaced apart from the gate electrodes, penetrating through the second insulating layer and the second substrate to vertically extend the second substrate, and having a bent portion,
wherein the separation region includes a first region extending from above in trench form, and a second region connected to a lower end of the first region.

19. The semiconductor device as claimed in claim 18, wherein the second region connects to the first region within the second substrate, has a width greater than a width of the first region, and has a rounded external surface.

20. The semiconductor device as claimed in claim 19, wherein the second region has a shape formed by isotropic etching.

* * * * *